(12) United States Patent  (10) Patent No.: US 12,200,938 B2
Liu et al.  (45) Date of Patent: Jan. 14, 2025

(54) DRIVER PLACEMENT IN MEMORIES HAVING STACKED MEMORY ARRAYS

(71) Applicant: Lodestar Licensing Group LLC, Evanston, IL (US)

(72) Inventors: Haitao Liu, Boise, ID (US); Kamal M. Karda, Boise, ID (US); Gurtej S. Sandhu, Boise, ID (US); Sanh D. Tang, Boise, ID (US); Akira Goda, Boise, ID (US); Lifang Xu, Boise, ID (US)

( * ) Notice: Subject to any disclaimer, the term of this patent is extended or adjusted under 35 U.S.C. 154(b) by 0 days.

(21) Appl. No.: 18/497,790

(22) Filed: Oct. 30, 2023

(65) Prior Publication Data

US 2024/0147729 A1   May 2, 2024

Related U.S. Application Data

(60) Continuation of application No. 17/145,131, filed on Jan. 8, 2021, now Pat. No. 11,805,653, which is a
(Continued)

(51) Int. Cl.
| | |
|---|---|
| *H01L 27/115* | (2017.01) |
| *G11C 16/08* | (2006.01) |
| *H01L 21/28* | (2006.01) |
| *H01L 23/532* | (2006.01) |
| *H10B 43/10* | (2023.01) |
| *H10B 43/27* | (2023.01) |

(Continued)

(52) U.S. Cl.
CPC ............ *H10B 43/40* (2023.02); *G11C 16/08* (2013.01); *H01L 23/5329* (2013.01); *H01L 29/40117* (2019.08); *H10B 43/10* (2023.02); *H10B 43/27* (2023.02); *H10B 43/35* (2023.02); *H10B 41/10* (2023.02); *H10B 41/27* (2023.02); *H10B 41/35* (2023.02); *H10B 41/40* (2023.02)

(58) Field of Classification Search
None
See application file for complete search history.

(56) References Cited

U.S. PATENT DOCUMENTS

| 9,070,442 B2 | 6/2015 | Yip et al. |
| 10,283,493 B1 | 5/2019 | Nishida |

(Continued)

FOREIGN PATENT DOCUMENTS

| CN | 108028223 | 5/2018 |
| JP | 10-074919 | 3/1998 |
| JP | 2009238874 | 10/2009 |

OTHER PUBLICATIONS

International Search Report and Written Opinion for related PCT Application No. PCT/US2019/058827, dated Feb. 21, 2020, 12 pages.

(Continued)

*Primary Examiner* — Benjamin P Sandvik
(74) *Attorney, Agent, or Firm* — Brooks, Cameron & Huebsch, PLLC

(57) ABSTRACT

A memory can have a stacked memory array that can have a plurality of levels of memory cells. Each respective level of memory cells can be commonly coupled to a respective access line. A plurality of drivers can be above the stacked memory array. Each respective driver can have a monocrystalline semiconductor with a conductive region coupled to a respective access line.

19 Claims, 20 Drawing Sheets

Related U.S. Application Data division of application No. 16/248,248, filed on Jan. 15, 2019, now Pat. No. 10,903,223.

(51) Int. Cl.
  _H10B 43/35_  (2023.01)
  _H10B 43/40_  (2023.01)
  _H10B 41/10_  (2023.01)
  _H10B 41/27_  (2023.01)
  _H10B 41/35_  (2023.01)
  _H10B 41/40_  (2023.01)

(56) References Cited

U.S. PATENT DOCUMENTS

| | | |
|---|---|---|
| 2005/0263763 A1 | 12/2005 | Bhattacharyya |
| 2007/0267723 A1 | 11/2007 | Bernstein et al. |
| 2011/0169072 A1* | 7/2011 | Lim .................... H10B 43/27 257/E21.409 |
| 2011/0284946 A1 | 11/2011 | Kiyotoshi |
| 2012/0181602 A1 | 7/2012 | Fukuzumi et al. |
| 2014/0061750 A1 | 3/2014 | Kwon et al. |
| 2015/0349126 A1 | 12/2015 | Tanzawa |
| 2016/0240254 A1 | 8/2016 | Chen |
| 2016/0268304 A1 | 9/2016 | Ikeda et al. |
| 2017/0084310 A1 | 3/2017 | Chen |
| 2017/0250224 A1 | 8/2017 | Ratnam et al. |
| 2017/0256551 A1 | 9/2017 | Lee |
| 2017/0294377 A1 | 10/2017 | Dunga et al. |
| 2017/0330626 A1 | 11/2017 | Sakui |
| 2018/0166461 A1 | 1/2018 | Shim et al. |
| 2020/0152573 A1 | 5/2020 | Oh et al. |

OTHER PUBLICATIONS

Office Action for related Taiwan Patent Application No. 108139618, dated Aug. 5, 2020, 9 pages.

Office Action from related China Patent Application No. 20190089136.5, dated Nov. 22, 2021, 11 pages.

* cited by examiner

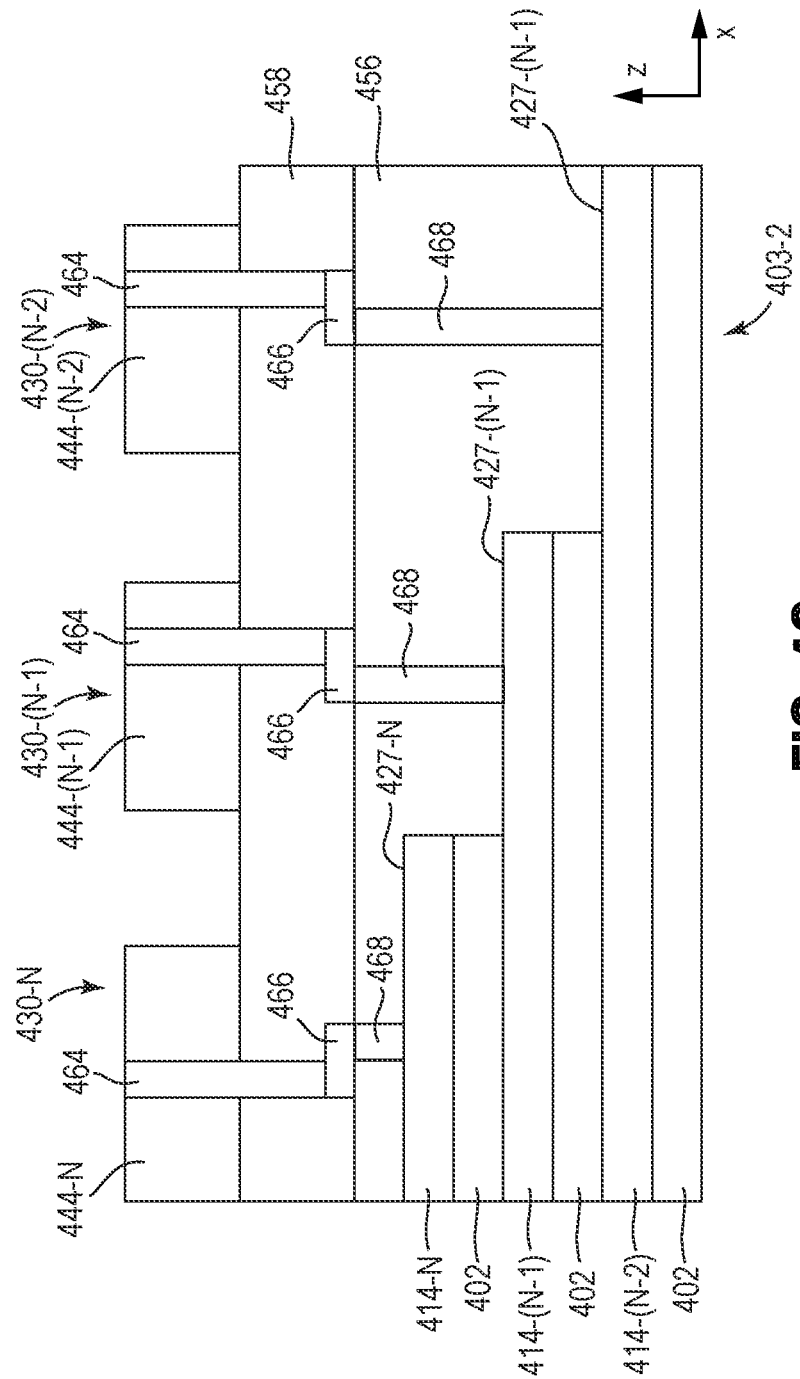

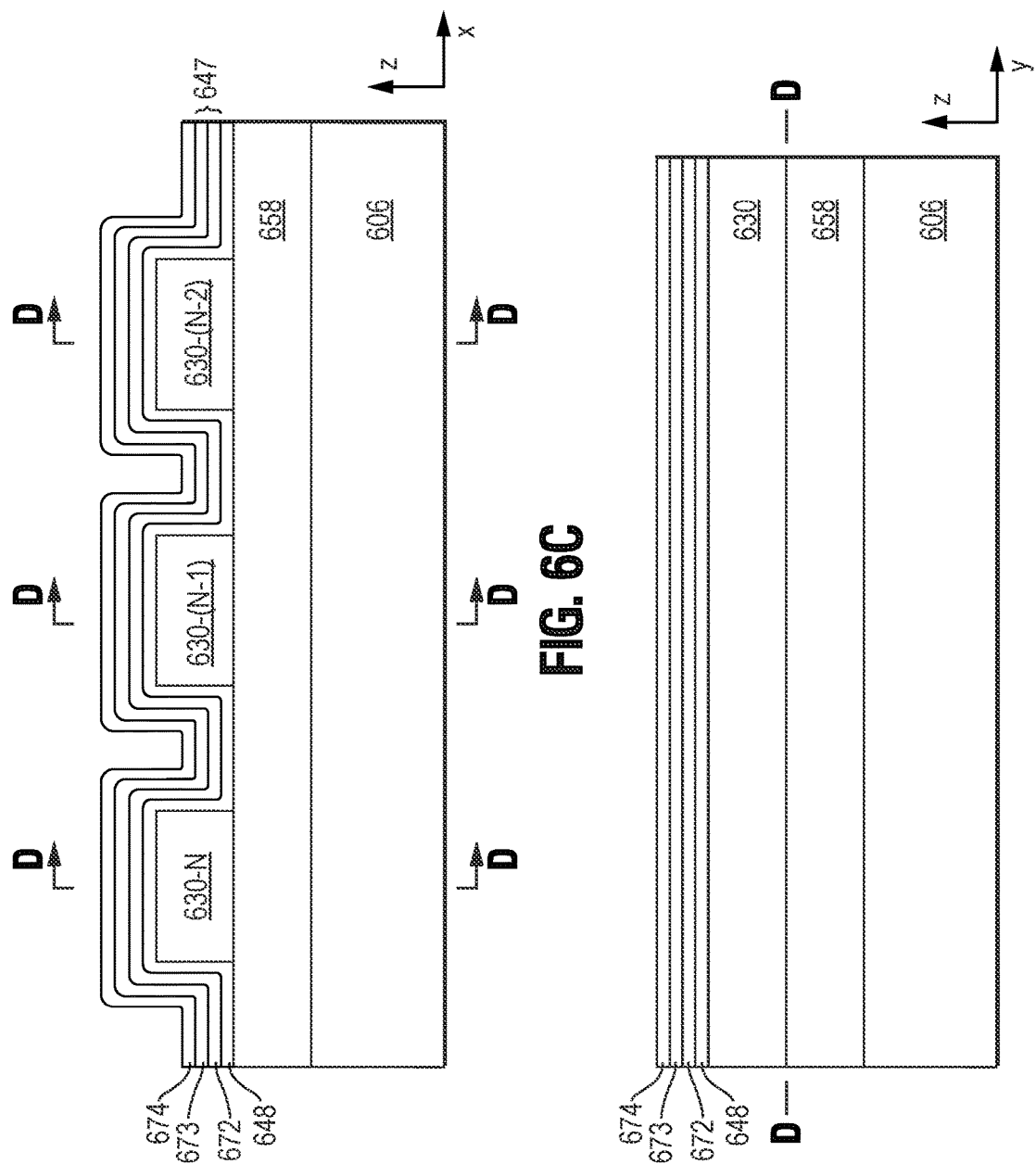

DRIVER PLACEMENT IN MEMORIES HAVING STACKED MEMORY ARRAYS

PRIORITY INFORMATION

This application is a Continuation of U.S. application Ser. No. 17/145,131, filed Jan. 8, 2021, which issues as U.S. Pat. No. 11,805,653 on Oct. 31, 2023, which is a Divisional of U.S. application Ser. No. 16/248,248, filed Jan. 15, 2019, which issued as U.S. Pat. No. 10,903,223 on Jan. 26, 2021, the contents of which are included herein by reference.

TECHNICAL FIELD

The present disclosure relates generally to electronic systems, such as memory systems, and more particularly, to driver placement in memories having stacked memory arrays.

BACKGROUND

Memory systems may be implemented in electronic systems, such as computers, cell phones, hand-held electronic devices, etc. Some memory systems, such as solid state drives (SSDs), embedded Multi-Media Controller (eMMC) devices, Universal Flash Storage (UFS) devices, and the like, may include non-volatile storage memories for storing host (e.g., user) data from a host. Non-volatile storage memories provide persistent data by retaining stored data when not powered and may include NAND flash memory, NOR flash memory, read only memory (ROM), Electrically Erasable Programmable ROM (EEPROM), Erasable Programmable ROM (EPROM), and resistance variable memory, such as phase change random access memory (PCRAM), three dimensional cross-point memory (e.g., 3D XPoint), resistive random access memory (RRAM), ferroelectric random access memory (FeRAM), magnetoresistive random access memory (MRAM), and programmable conductive memory, among other types of memory.

Memories can include memory arrays that can include groups of memory cells, such as blocks, sub-blocks, strings, etc. In some examples, a memory array can be a stacked memory array that can be referred to as a three-dimensional memory array, such as a three-dimensional NAND memory array. The memory cells at a common location (e.g., at a common vertical level) in a stacked memory array, for example, may form a level of memory cells, sometimes referred to as a tier of memory cells. The memory cells at each respective level can be commonly coupled to a respective common assess line, such as a word line, at the respective level. In some examples, the respective access lines at the respective levels can form steps of a stairstep structure. Memory cells from different levels can be coupled in series to form strings of series-coupled memory cells (e.g., a NAND string) between a select transistor coupled to a source and a select transistor coupled to a data line, such as a bit line.

BRIEF DESCRIPTION OF THE DRAWINGS

FIGS. 4B to 4D are various cross-sectional views associated with FIG. 4A in accordance with a number of embodiments of the present disclosure.

FIGS. 6A to 6I are various views corresponding to particular stages of processing associated with forming a memory in accordance with a number of embodiments of the present disclosure.

DETAILED DESCRIPTION

A driver, such as string driver, can be used to selectively supply access signals, such as programming signals (e.g., programming voltages), to an access line at a particular level of a stacked array to access (e.g., to program) the memory cells coupled to the access line. There can be a respective string driver coupled to each respective access line in the memory array. For example, a respective string driver can be coupled to each respective step corresponding to a respective access line. Note that such drivers can sometimes be referred to as access-line (e.g., word-line) drivers. Various current approaches place the respective string drivers under the array so that there is a respective string driver for each respective level of the array under the stacked array.

To meet the demand for higher capacity memories, designers continue to strive for increasing memory density (e.g., the number of memory cells in a given base area of an integrated circuit die). One way to increase the density of memory devices in stacked arrays is to increase the number of levels of memory cells, and thus the number of access lines and the number of sting drivers. However, there might not be enough room under the stacked memory array to accommodate the increased number of string drivers without increasing the base area (e.g., the footprint) of an integrated circuit die. Moreover, placing string drivers underneath the memory array can lead to more complex routing in a stacked array as the number of levels increases.

The present disclosure addresses the problem of accommodating the increased number of string drivers under stacked memory array by moving the string drivers above the memory array. Each of the drivers can have a monocrystalline semiconductor with a conductive region that is coupled to a respective access line. The monocrystalline semiconductor can act to reduce the resistance of the drivers and current leakage in the drivers compared to previous approaches that typically employ polycrystalline semiconductors, such as polysilicon. For example, the higher resistance and current leakage associated with using polycrystalline semiconductors can degrade the performance of the drivers, and thus of the memories that employ the drivers.

In some examples, the monocrystalline semiconductor formed and is subsequently transferred to a surface of a dielectric that is above the memory array using a transfer technique that avoids forming the monocrystalline semiconductor on the surface of the dielectric, such as by using various deposition techniques. For example, it can be difficult to form monocrystalline semiconductors on dielectrics.

Figure 1:
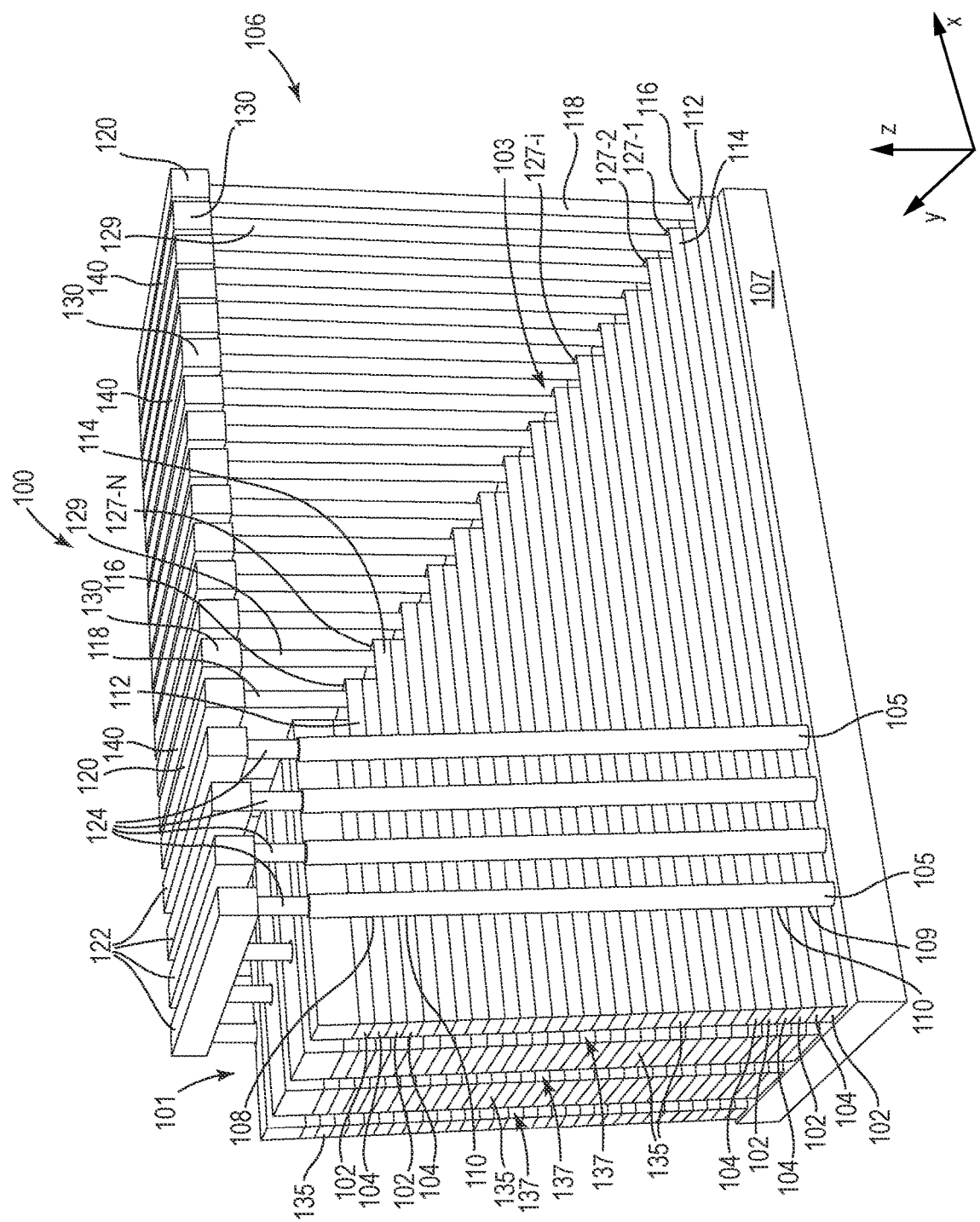
FIG. 1 illustrates an apparatus in accordance a number of embodiments of the present disclosure.

FIG. 1 illustrates a portion of an apparatus, such as a portion of a memory 100 (e.g., a NAND memory) in accordance a number of embodiments of the present disclosure. Memory 100 can include a stacked memory array 106, such as a stacked NAND memory array. Array 106 can include a memory-cell region 101 and a stair-step structure 103 adjacent to memory-cell region 101.

Array 106 can include a stack of dielectrics 102 alternating with conductors 104 in the z-direction (e.g., the vertical direction) in the frame of reference of FIG. 1. Semiconductor structures 105, such as semiconductor pillars, pass through the stack in memory cell region 101 in the z-direction and terminate at an upper surface of or in a semiconductor 107. A select transistor 108 can be adjacent to each semiconductor structure 105 at a level corresponding to the uppermost conductor 104, and a select transistor 109 can be adjacent to each semiconductor structure 105 at a level corresponding the lowermost conductor 104.

Memory cells 110 can be adjacent to each semiconductor structure 105 at levels corresponding to the conductors 104 between the uppermost and lowermost conductors 104. The memory cells 110 at each respective level are commonly coupled to the conductor 104 at the respective level. For example, the memory cells 110 at level in array 106 can be referred to as a level of memory cells, such as a tier of memory cells. The memory cells 110 adjacent to a semiconductor structure at the different levels 105 can be coupled in series to form a string (e.g., a vertical string) of series-coupled memory cells, such as a NAND string of memory cells.

The uppermost and lowermost conductors 104 can be select lines 112 that form or are coupled to gates of select transistors 108 and 109, respectively. The conductors 104 between the uppermost and lowermost conductors 104 can be access lines 114 that can be referred to as word lines and that form or are coupled to control gates of memory cells 110. Note that the memory cells 110 at each respective level are commonly coupled to the access line 114 at the respective level.

Stairstep structure 103 includes uppermost and lowermost steps 116 that can each include a portion of respective select line 112 over an adjacent dielectric 102. A respective contact 118 is coupled to the respective select line 112 of each respective step 116. Respective contacts 118 (e.g., vertical contacts) are coupled to activation circuitry by respective lines 120. Data lines 122 are coupled to semiconductor structures 105 by data line contacts 124.

In some examples, stairstep structure 103 includes steps 127-1 to 127-N between the uppermost and lowermost steps 116 that can each include a portion of a respective access line 114 over an adjacent dielectric 102. A respective contact 129 (e.g., vertical contact) is coupled to the respective access line 114 of each respective step 127. For example, a step, such as a step 127, including an access line, such as an access line 114, can be referred to as an access line step.

In some examples, the respective contacts 129 are coupled to respective string drivers 140 that can be field effect transistors (FETs) and are over (e.g., above) stairstep structure 103 and thus array 106. The respective string drivers 140 can be various string drivers disclosed herein. The string drivers can be configured to selectively couple the access lines 114 to access signals to access the memory cells 110 commonly coupled to the access lines. For example, the access signals can be programming signals, such as programming voltages, for programming memory cells 110.

The respective string drivers 140 can include respective monocrystalline semiconductors 130 (e.g., of monocrystalline silicon (Si), monocrystalline silicon germanium (SiGe), monocrystalline germanium (Ge), or the like) that are over (e.g., above) stairstep structure 103 and thus array 106. For example, above can be stairstep structure 103, and thus array 106, can be between string drivers 140 and semiconductor 107. A respective string driver 140 can include a gate (not shown in FIG. 1) formed over and coupled to a respective monocrystalline semiconductor 130. The respective contacts 129 can be coupled to conductive regions, such as source/drains, (not shown in FIG. 1) that can be formed in the respective monocrystalline semiconductors 130. In some examples, the respective monocrystalline semiconductors 130 can be directly above (e.g., vertically above and horizontally aligned with) the respective steps 127 and can be formed over a dielectric (not shown in FIG. 1) that can be formed over memory-cell region 101 and stairstep structure 103.

Note that monocrystalline semiconductors 130 are distributed in the x-direction and extend in the y-direction in the frame of reference of FIG. 1. In some examples, a gate can extend in the x-direction and be commonly coupled to the monocrystalline semiconductors 130 distributed in the x-direction.

As discussed further herein, each monocrystalline semiconductor 130 can form a portion of at least one string driver so that the string drivers are above array. For example, a string driver can include a control gate (not shown in FIG. 1) formed over a respective monocrystalline semiconductor 130. The string drivers can be configured to selectively couple the access lines 114 to access signals to access the memory cells 110 commonly coupled to the access lines. For example, the access signals can be programming signals, such as programming voltages, for programming memory cells 110.

In other examples, each respective monocrystalline semiconductor 130 can be replaced by a respective line, such as a line 120 (not shown in FIG. 1), that can be coupled to a respective contact 129 so that there can be respective line coupled to each respective step 127. Each respective line coupled to a respective step 127 can be coupled to a respective string driver that can be formed directly above memory-cell region 101 (not shown in FIG. 1). For example, the string drivers might be formed over data lines 122.

Array 106 can be divided into blocks 135 of memory cells 110 that can sometimes be referred to as subblocks. For example, a block of memory cells can refer to a group of memory cells that is commonly erased. Dielectrics (not shown in FIG. 1) can be formed in openings 137 to electrically isolate blocks 135 from each other. Note that blocks 135 are distributed in the y-direction in the frame of reference of FIG. 1.

Figure 2:
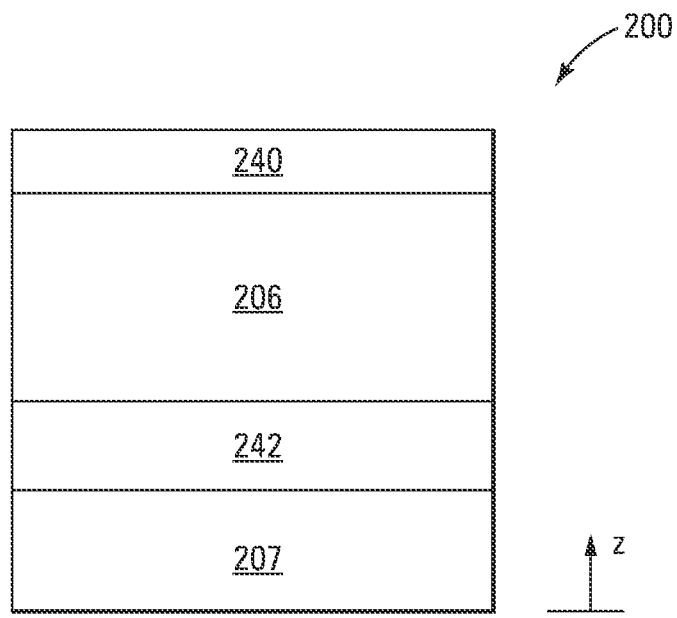
FIG. 2 illustrates a portion of a memory in accordance with a number of embodiments of the present disclosure.

FIG. 2 illustrates a portion of a memory 200 that can be memory 100 in accordance with a number of embodiments of the present disclosure. Memory 200 can include string drivers 240 over a stacked memory array 206 that can be array 106. Array 206 can be over logic circuitry 242 that can be over a semiconductor 207. For example, string drivers 240 can be various string drivers disclosed herein. In some examples, there can be additional logic circuitry under array 206 (e.g., under semiconductor 207) that can facilitate the operation of memory 200.

String drivers 240 can be referred to as high-voltage string drivers because string drivers 240 might operate at around 30 volts, whereas logic circuitry 242 can be referred to as low-voltage logic circuitry because logic circuitry 242 might operate at around three volts. In some examples, string drivers 240 can include monocrystalline semiconductors, such as monocrystalline semiconductors 130. Logic circuitry 242 can be coupled to gates of string drivers 240 for activating string drivers 240. In some examples, logic circuitry 242 can include complementary-metal-oxide-semiconductor (CMOS) circuitry.

Figure 3:
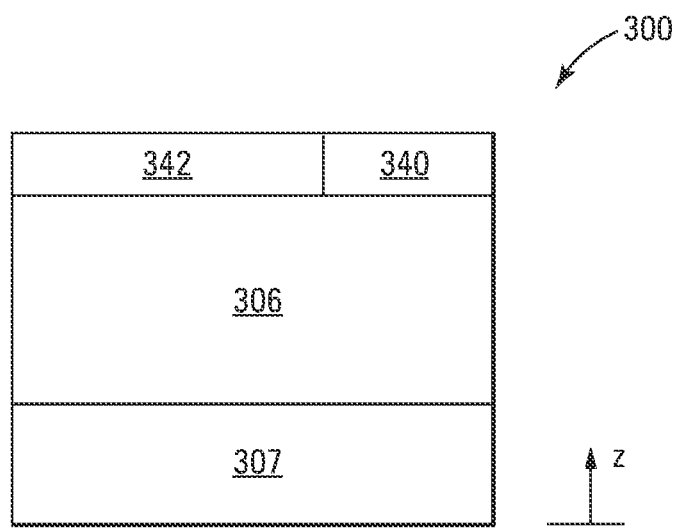
FIG. 3 illustrates a portion of a memory in accordance with a number of embodiments of the present disclosure.

FIG. 3 illustrates a portion of a memory 300 that can be memory 100 in accordance with a number of embodiments of the present disclosure. Memory 300 can include string drivers 340, such as high-voltage string drivers, over a stacked memory array 306 that can be array 106. In some examples, string drivers 340 can include monocrystalline semiconductors, such as monocrystalline semiconductors 130. Logic circuitry 342, such as low-voltage CMOS circuitry, can be at the same level as string drivers 340 and can be over memory array 306. Logic circuitry 342 can be coupled to control gates of string drivers 340 for activating string drivers 340.

Figure 4A:
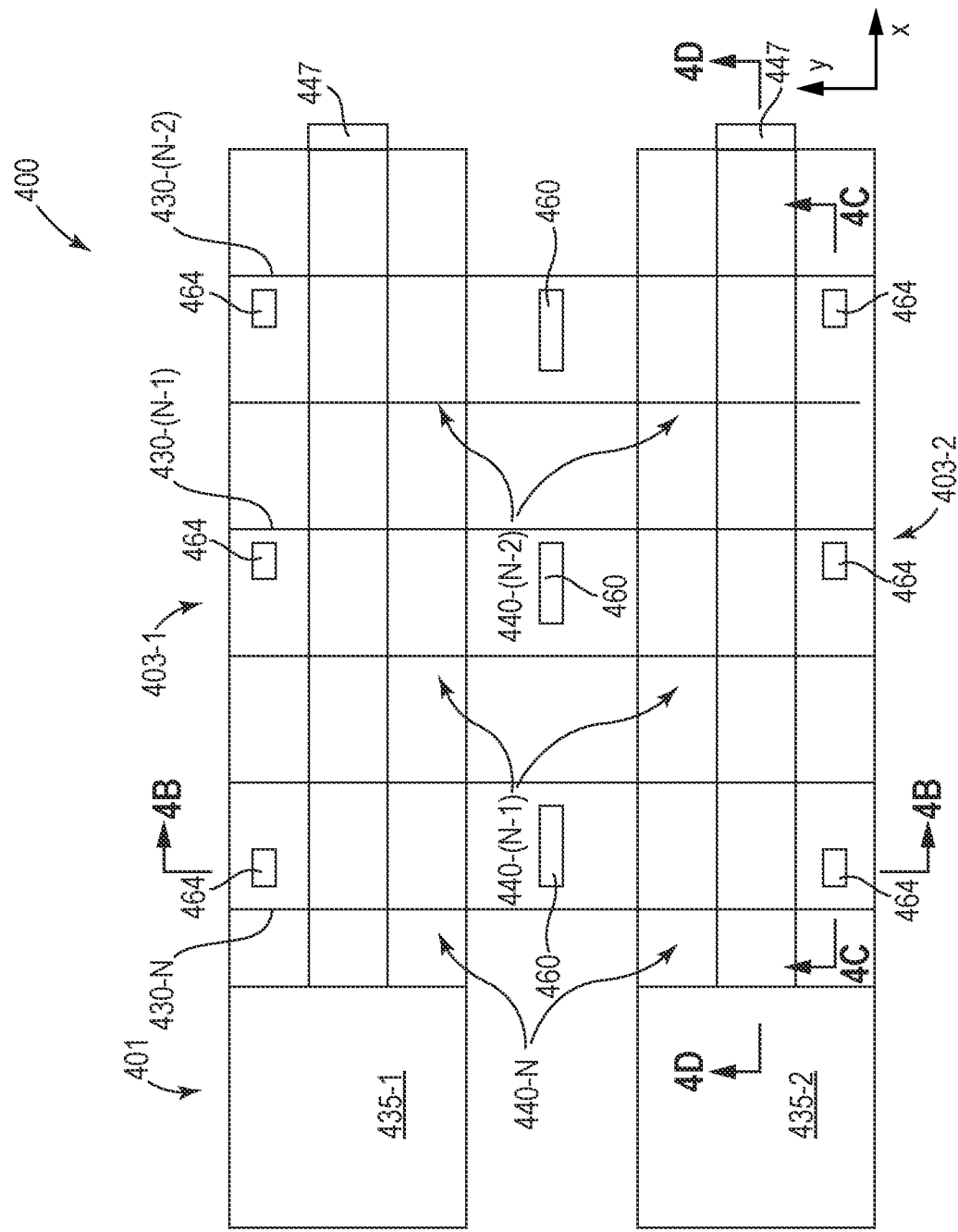
FIG. 4A is a top-down view of a portion of a memory in accordance with a number of embodiments of the present disclosure.
Figure 4B:
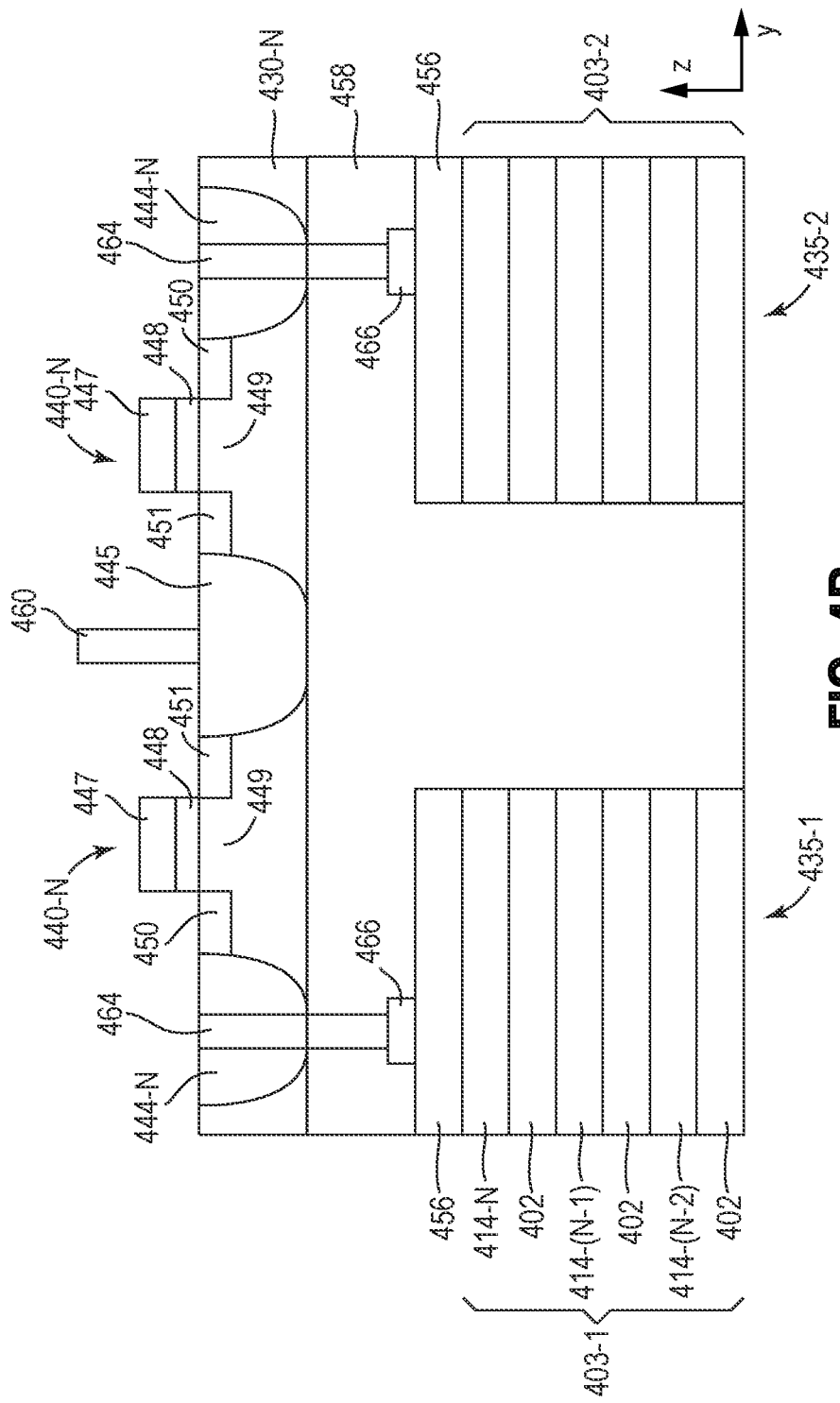
Figure 4D:
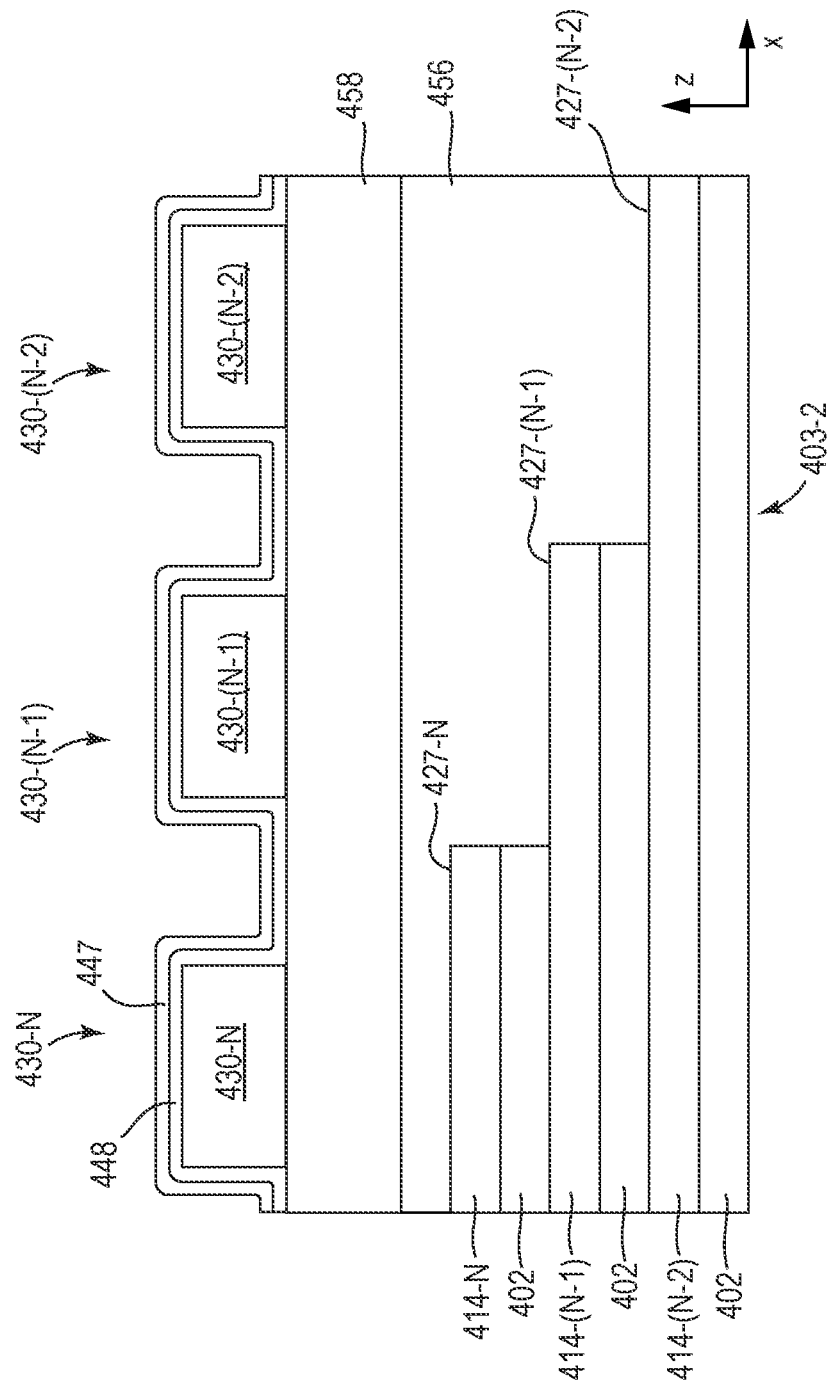

FIG. 4A is a top-down view of a portion of a memory 400, that can be various memory described herein, in accordance with a number of embodiments of the present disclosure. FIGS. 4B to 4D are various cross-sectional views associated with FIG. 4A in accordance with a number of embodiments of the present disclosure. FIG. 4B is a cross-sectional view in the y-z plane viewed along line 4B-4B in FIG. 4A; FIG. 4C is a cross-sectional view in the x-z plane viewed along line 4C-4C in FIG. 4A; and FIG. 4D is a cross-sectional view in the x-z plane viewed along line 4D-4D in FIG. 4A.

In FIG. 4A, blocks 435-1 and 435-2 in memory-cell region 401 respectively correspond to respective stairstep structures 403-1 and 403-2. For example, blocks 435-1 and 435-2 can be respectively coupled to stairstep structures 403-1 and 403-2. Stairstep structures 403-1 and 403-2 each include steps 427-(N−2) to 427-N that respectively include access lines 414-(N−2) to 414-N, as shown in FIGS. 4C and 4D. Each of the respective access lines 414-(N−2) to 414-N is over a respective dielectric 402. Each of the respective access lines 414-(N−2) to 414-N is commonly coupled to a respective level of memory cells in the respective block 435.

String drivers 440-(N−2) to 440-N can be directly above stairstep structures 403-1 and 403-2 and can be respectively directly above steps 427-(N−2) to 427-N of each of stairstep structures 403-1 and 403-2, as shown in FIG. 4D for stairstep structure 403-2. Each of string drivers 440-(N−2) to 440-N can include a monocrystalline semiconductor. For example, string drivers 440-(N−2) to 440-N can respectively include portions of monocrystalline semiconductors 430-(N−2) to 430-N.

Each of the string drivers 440 can include, in its respective monocrystalline semiconductor 430, a respective conductive region, such as a respective source/drain 444, coupled the respective access line 414 of a respective step 427. For example, as shown in FIG. 4C, monocrystalline semiconductors 430-(N−2) to 430-N respectively of string drivers 440-(N−2) to 440-N include source/drains 444-(N−2) to 444-N respectively coupled to access lines 414-(N−2) to 414-N.

Each of the respective string drivers 440 can include, in its respective monocrystalline semiconductor 430, a respective source/drain 445 that can be coupled to receive access signals that can be selectively coupled to a respective access line in response to activating the respective string driver 440. For example, as shown in FIG. 4B, a source/drain 445 can be common to adjacent string drivers, such as the adjacent string drivers 440-N. As such, adjacent string drivers can share a source/drain 445. Note that source/drain 445 can be between stairstep structures 403-1 and 403-2, and thus blocks 435-1 and 435-2. In some examples, string drivers 440 can be field effect transistors (FETs).

As shown in FIGS. 4A, 4B, and 4D, each of the respective string drivers 440 can include a portion of a common gate 447. For example, the string drivers 440-(N−2) to 440-N of each of the respective blocks 435-1 and 435-2 can be commonly coupled to a respective gate 447. As shown in FIGS. 4B and 4D, portions of a respective gate 446 can be adjacent to (e.g., over) a respective gate dielectric 448 (e.g., gate oxide) that can be over (e.g., in direct physical contact with) and common to the monocrystalline semiconductors 430-(N−2) to 430-N. For example, a gate 447 can be coupled to (e.g., by direct physical contact with) the gate dielectric 448.

Each of the respective string drivers 440 can include a channel region 449 in its respective monocrystalline semiconductor 430 between source/drains 444 and 445, as shown in FIG. 4B for string drivers 440-N, monocrystalline semiconductor 430-N, and source/drains 444-N and 445. The gate dielectric 448 can be over (e.g., and in direct physical contact with) the channel region 449. A conductive channel can be formed in the channel region 449 in response to activating the string driver 440.

Source/drains 444 and 445 can be conductively doped to have an N+ conductivity level. In some examples, a portion 450 of each respective monocrystalline semiconductor 430 between the channel region 449 and the source/drain 444, such as source/drain 444-N in FIG. 4B. Conductive regions 451 (e.g., N− conductive implants) can be formed in portions of each respective monocrystalline semiconductor 430 between the channel region 449 and the source/drain 445 by doping the portions to have an N− conductivity level that has a lower conductivity level that the N+ conductivity level.

Monocrystalline semiconductors 430-(N−2) to 430-N are directly above stairstep structures 403-1 and 403-2 and are respectively directly above steps 427-(N−2) to 427-N of stairstep structures 403-1 and 403-2, as shown in FIG. 4D for stairstep structure 403-2. A dielectric 456 that can be oxide, nitride, or the like, can be formed adjacent to (e.g., over) each of stairstep structures 403-1 and 403-2, as shown in FIGS. 4B to 4D. A dielectric 458 that can be oxide, nitride or the like, can then be formed over dielectric 456. As such, dielectric 458 can be directly above stairstep structures 403-1 and 403-2, as shown in FIGS. 4B to 4D. In some examples, dielectric 458 can extend over memory-cell region 401 (which is not shown in FIGS. 4A to 4D). For example, dielectric 458 can be over data lines 122 in FIG. 1 (not shown in FIG. 1).

Monocrystalline semiconductors 430-(N−2) to 430-N are over and attached to dielectric 458. For example, monocrystalline semiconductors 430-(N−2) to 430-N can be bonded in direct physical contact with an upper surface of dielectric 458 so that monocrystalline semiconductors 430-(N−2) to 430-N are above dielectric 458. The gate dielectric 448 is formed over monocrystalline semiconductors 430-(N−2) to 430-N, as shown in FIGS. 4B and 4D, so that gate dielectric 448 is commonly coupled to monocrystalline semiconductors 430-(N−2) to 430-N. For example, gate dielectric 448 can be in direct physical contact with each of monocrystalline semiconductors 430-(N−2) to 430-N). Note that gate dielectric 448 can wrap around a portion of each of monocrystalline semiconductors 430-(N−2) to 430-N to be adjacent to the upper surface and the sides of each of monocrystalline semiconductors 430-(N−2) to 430-N.

A gate 447 can be adjacent to gate dielectric 448, as shown in FIGS. 4B and 4D. Gate 447 is commonly coupled to each of monocrystalline semiconductors 430-(N−2) to 430-N through gate dielectric 448. In some examples, gates 447 can be coupled to logic circuitry, such as logic circuitry 242 or 342, to receive control signals such as activation signals, to activate the string drivers 440 commonly coupled thereto.

A respective contact 460 can be coupled to each respective source/drain 445, such as to an upper surface of each respective source/drain 445. As such, contacts 460 can be between the steps of stairstep structures 403-1 and 403-2, and thus blocks 435-1 and 435-2. In some examples, contacts 460 can be coupled to receive access signals.

A respective (e.g. vertical) contact 464 can be formed through each respective source/drain 444, such as each of the respective source/drains 444-(N−2) to 444-N in FIGS. 4B and 4C. For example, each respective contact 464 can pass through a portion of dielectric 458 and can be coupled to (e.g., by direct physical contact with) a respective conductor, such as a respective conductive offset 466, formed over (e.g., in direct physical contact with) an upper surface of dielectric 456.

A respective conductor, such as a respective conductive plug 468, can couple each respective conductive offset 466 to each of the respective access lines 414-(N−2) to 414-N. For example, a respective (e.g., vertical) conductive plug 468 can be coupled to (e.g., by direct physical contact with) the respective access line 414 and the respective conductive offset 466 and can pass through dielectric 456.

Note that the respective conductive offset 466 can be a lateral offset that can extend laterally with respect to the z-direction (e.g., in the x-direction) over the upper surface of dielectric 456 from a respective contact 464 to a respective conductive plug 468 so that the respective contact 464 can be offset laterally from the respective conductive plug 468. In some examples, a respective contact 464, a respective conductive offset 466, and a respective conductive plug 468 can be collectively referred to as a respective conductor that couples a respective source/drain 444 to a respective access line 414, and thus a respective step 427.

Figure 5A:
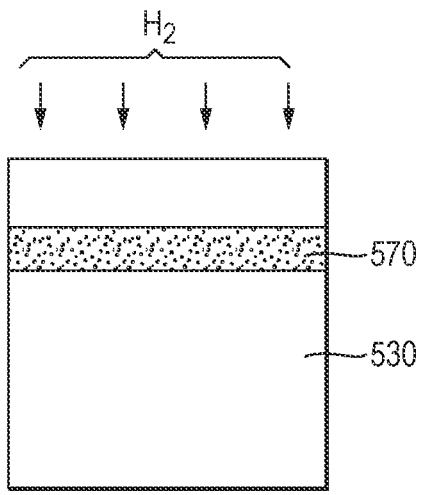
FIGS. 5A to 5C are various views corresponding to particular stages of processing associated with forming a memory in accordance with a number of embodiments of the present disclosure.
Figure 5B:
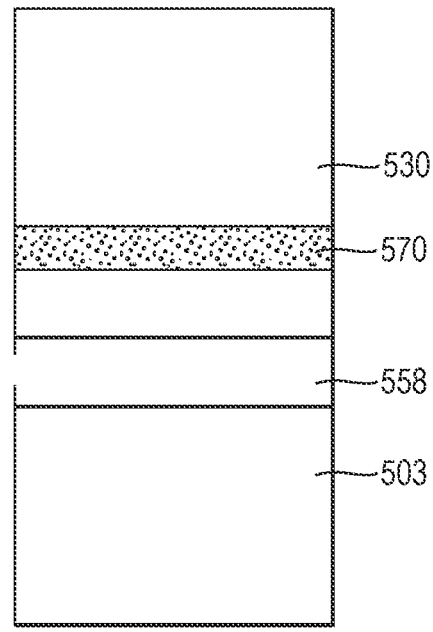
Figure 5C:
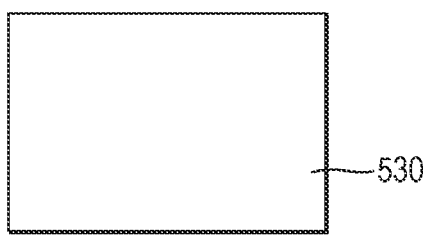
Figure 5C:
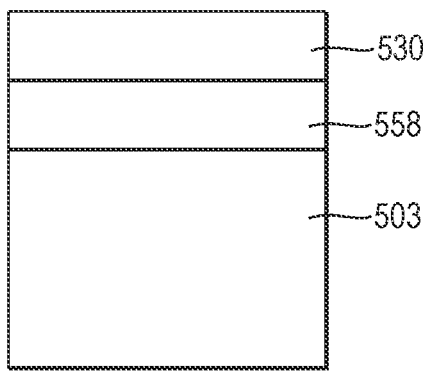

FIGS. 5A to 5C are various views corresponding to particular stages of processing associated with forming a memory in accordance with a number of embodiments of the present disclosure. In some examples, the processing described in conjunction with FIGS. 5A to 5C can be referred to as a transfer technique during which a monocrystalline semiconductor, such as monocrystalline silicon, can be formed and subsequently transferred to a surface of a dielectric. For example, it can be difficult to form a monocrystalline semiconductor in contact with a dielectric (e.g., using various deposition techniques).

In FIG. 5A, hydrogen ($H_2$) is implanted in a monocrystalline semiconductor 530 to form a hydrogen implant 570 in monocrystalline bulk semiconductor 530. In FIG. 5B, monocrystalline bulk semiconductor 530, including hydrogen implant 570, is coupled (e.g., attached) to a dielectric 558, that can be dielectric 458, formed over a stairstep structure 503 that can be stairstep structure 103, 403-1 or 403-2. For example, monocrystalline bulk semiconductor 530 can be inverted and subsequently attached to dielectric 558 by bonding monocrystalline bulk semiconductor 530 in direct physical contact with an upper surface of dielectric 558.

After monocrystalline bulk semiconductor 530 is bonded to dielectric 558, the structure in FIG. 5B is annealed (e.g., at about 400° C.) to remove the hydrogen and to create a relatively fragile (e.g., brittle) region at the site of the removed hydrogen. In FIG. 5C, monocrystalline bulk semiconductor 530 is cleaved at the fragile region, leaving a portion of monocrystalline bulk semiconductor 530 bonded to dielectric 530. Note that it can be difficult to form a monocrystalline semiconductor in contact with a dielectric, and it is for this reason, for example, that monocrystalline semiconductor 530 is formed and subsequently bonded to dielectric 558 in accordance with the process described in FIGS. 5A to 5C.

Figure 6A:
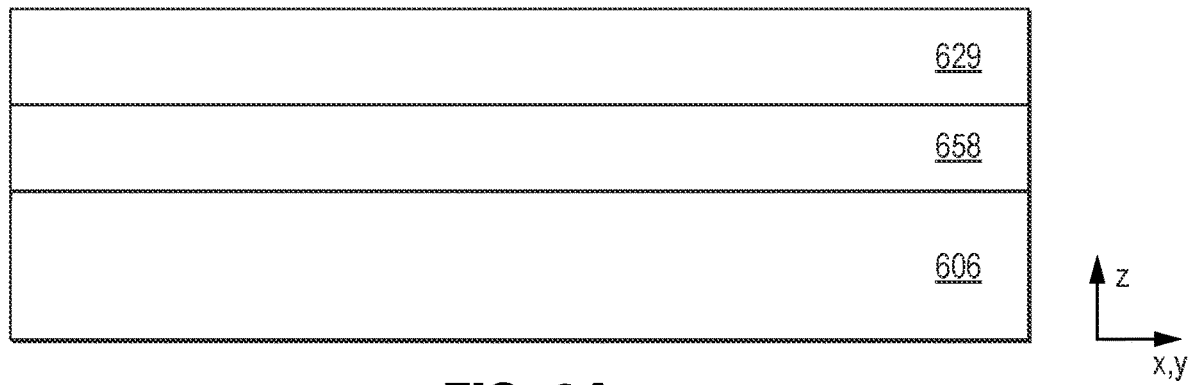

FIGS. 6A to 6I are various views corresponding to particular stages of processing associated with forming a memory in accordance with a number of embodiments of the present disclosure. FIG. 6A can be a cross section in the x-z plane or the y-z plane corresponding to a particular stage of processing. In some examples, a processing stage can include a number of steps that can have a number of sub-steps.

In FIG. 6A, a stacked memory array 606, that can be various the memory arrays disclosed herein, is formed. A dielectric 658 that can be dielectric 458 or 558 can be formed above memory array 606. A monocrystalline semiconductor 629 (e.g., monocrystalline silicon) that can be monocrystalline semiconductor 530 can be attached to an upper surface of dielectric 658 (e.g., as previously described in conjunction with FIGS. 5A to 5C) so that monocrystalline semiconductor 629 is above (e.g., and in direct physical contact with) the upper surface of dielectric 658. For example, monocrystalline semiconductor 629 can be formed and subsequently transferred to the upper surface dielectric 658 using the transfer technique described in conjunction with FIGS. 5A to 5C, so as to avoid the difficulties associated with forming monocrystalline semiconductor 629 on the upper surface dielectric 658.

Figure 6B:
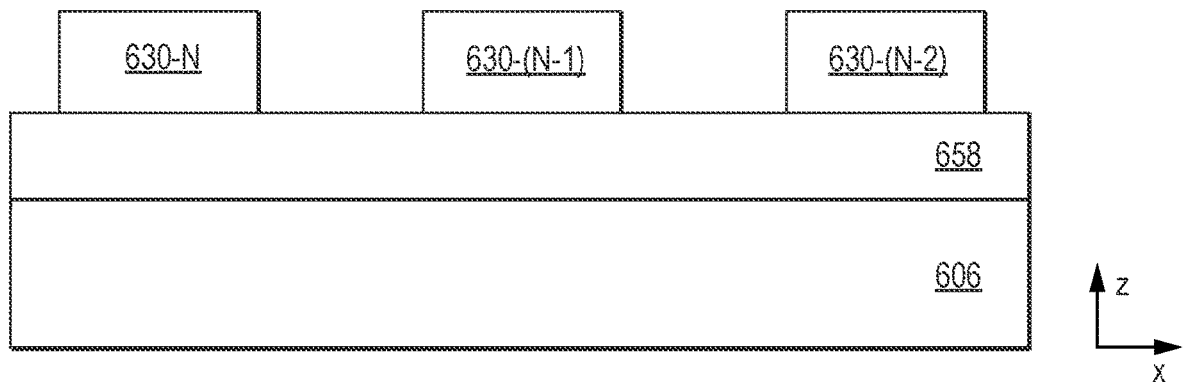

FIG. 6B is a cross-section in the x-z plane corresponding to a particular stage of processing following the stage of processing corresponding to FIG. 6A. For example, a mask (e.g., photoresist) can be formed over semiconductor 629 in FIG. 6A and patterned to expose portions of semiconductor 629 for removal. The portions can be subsequently removed (e.g., by etching), stopping at the upper surface of dielectric 658 to form monocrystalline semiconductor segments 630-(N−2) to 630-N than can respectively be monocrystalline semiconductors 430-(N−2) to 430-N.

FIG. 6C is a cross-section in the x-z plane corresponding to a particular stage of processing following the stage of processing corresponding to FIG. 6B. FIG. 6D is a cross-section in the y-z plane, as viewed along any one of the lines D-D in FIG. 6C, corresponding to the particular stage of processing of FIG. 6C. As such, reference number 630 can be used in FIG. 6D and subsequent views in the y-z plane to generally refer to each, or any, of monocrystalline semiconductor segments 630-(N−2) to 630-N. The structures in FIGS. 6C and 6D can be formed concurrently, for example.

In FIGS. 6C and 6D, a dielectric, such as a gate dielectric 648 that can be gate dielectric 448, is formed over the structures of FIGS. 6C and 6D concurrently. For example, gate dielectric 648 can be formed over each of monocrystalline semiconductor segments 630-(N−2) to 630-N and can wrap around a portion of each of monocrystalline semiconductor segments 630-(N−2) to 630-N so as to be adjacent to the upper surface and the sides of each of monocrystalline semiconductor segments 630-(N−2) to 630-N.

A conductor 672, such as polysilicon, is then formed over (e.g., in direct physical contact with) gate dielectric 648 in FIGS. 6C and 6D concurrently such that conductor 672 wraps around a portion of each of monocrystalline semiconductor segments 630-(N−2) to 630-N. For example, conductor 672 can be adjacent to the upper surface and the sides of gate dielectric 648 that are adjacent to the upper surface and the sides of semiconductor segments 630-(N−2) to 630-N.

A conductor 673, such as metal, is then formed over (e.g., in direct physical contact with) conductor 672 in FIGS. 6C and 6D concurrently such that conductor 673 wraps around a portion of each of monocrystalline segments 630-(N−2) to 630-N. For example, conductor 673 can be adjacent to the upper surface and the sides of conductor 672 that are adjacent to the upper surface and the sides of gate dielectric 648. In some examples, conductor 672 and conductor 673 can collectively form a gate 647 that can be gate 447.

A dielectric 674 that can be different from dielectric 658 is then formed over (e.g., in direct physical contact with) conductor 673 in FIGS. 6C and 6D concurrently such that dielectric 674 wraps around a portion of each of semiconductor segments 630-(N−2) to 630-N. For example, dielectric 674 can be adjacent to the upper surface and the sides of conductor 673 that are adjacent to the upper surface and the sides of gate conductor 673. In some examples, dielectric 674 can be nitride when dielectric 658 is oxide and can be oxide when dielectric 658 is nitride.

Figure 6E:
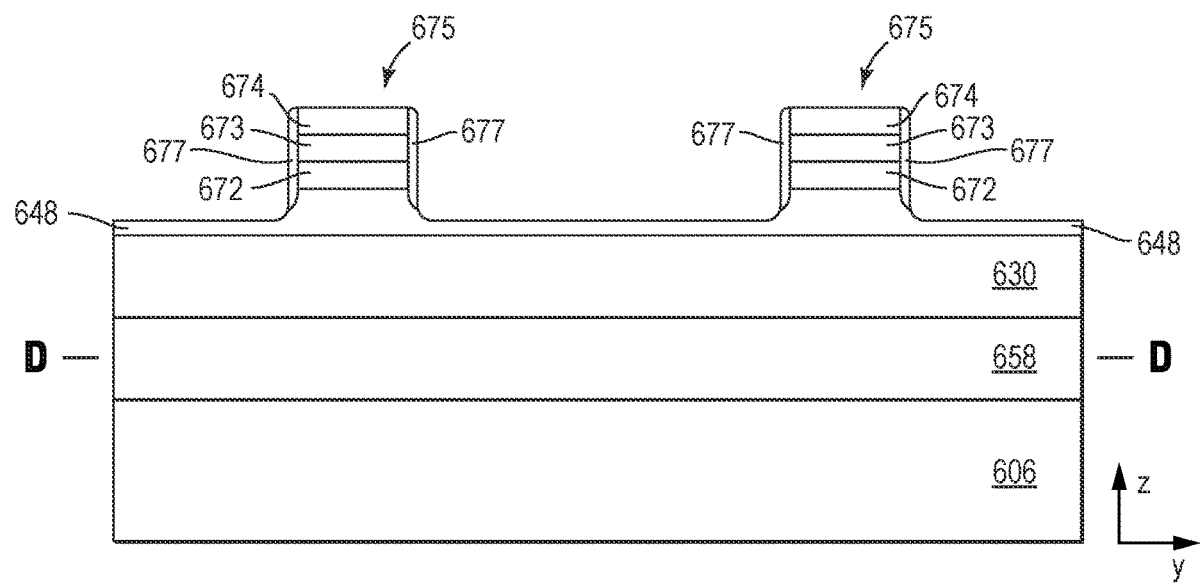

FIG. 6E is a cross-section in the y-z plane, as viewed along any of the lines D-D in FIG. 6C, corresponding to a particular stage of processing following the stage of processing corresponding to FIGS. 6C and 6D. For example, a mask (e.g., photoresist) can be formed over dielectric 674 in FIG. 6D and patterned to expose portions of dielectric 674, conductor 673, and conductor 672 for removal. The portions of dielectric 674, conductor 673, and conductor 672 can be subsequently removed (e.g., by etching), stopping in gate dielectric 648 to leave some of gate dielectric 648 over monocrystalline semiconductor segment 630.

The removal process forms stacks 675 over monocrystalline semiconductor segment 630 that include gate dielectric 648, conductor 672 over gate dielectric 648, conductor 673 over conductor 672, and dielectric 674 over conductor 673. Subsequently, dielectric spacers 677 are formed on the (e.g., vertical) sides of stacks 677. For example, dielectric spacers 677 can be formed on the (e.g., vertical) sides of dielectric 674, conductor 673, and conductor 672 and a portion of gate dielectric 648. In some examples, dielectric spacers 677 can be the same dielectric as dielectric 674. Spacers 677 can facilitate the formation of self-aligned conductive implants in monocrystalline semiconductor segment 630 in a subsequent processing stage.

Figure 6F:
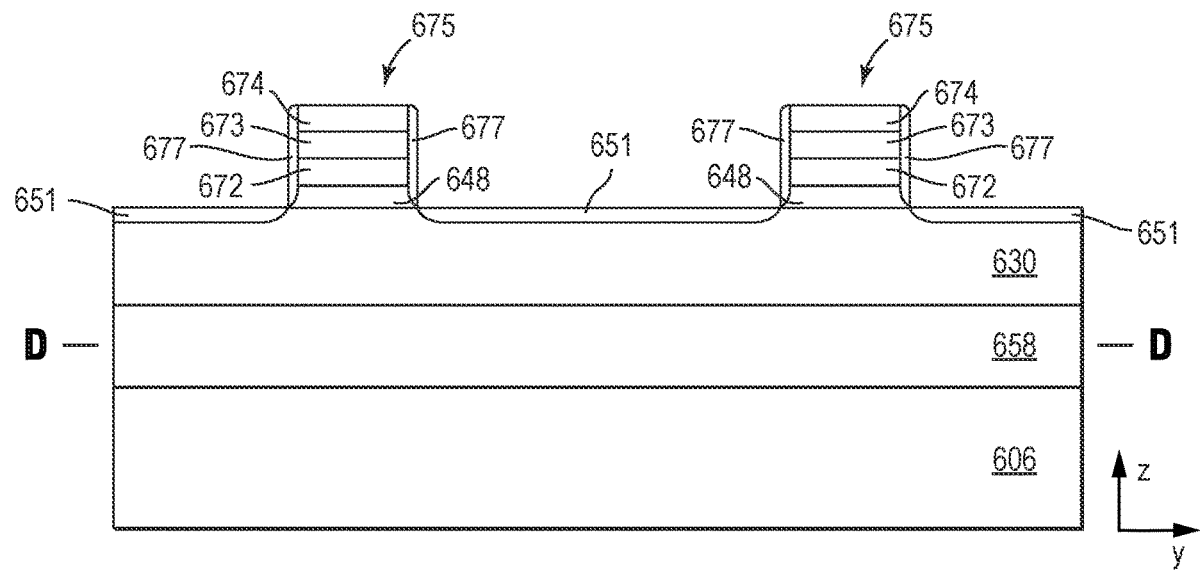

FIG. 6F is a cross-section in the y-z plane, as viewed along any of the lines D-D in FIG. 6C, corresponding to a particular stage of processing following the stage of processing corresponding to FIG. 6E. In FIG. 6F, the dielectric 674 and dielectric spacers 677 serve as a mask that protects stacks 675 while the portion of gate dielectric 648 that is not protected is removed from monocrystalline semiconductor segment 630. Subsequently, conductive regions 651 (e.g., N− conductive implants) that can be conductive regions 451 are implanted in monocrystalline semiconductor segment 630. For example, conductive regions 651 can be self-aligned as a result of spacers 677.

Figure 6G:
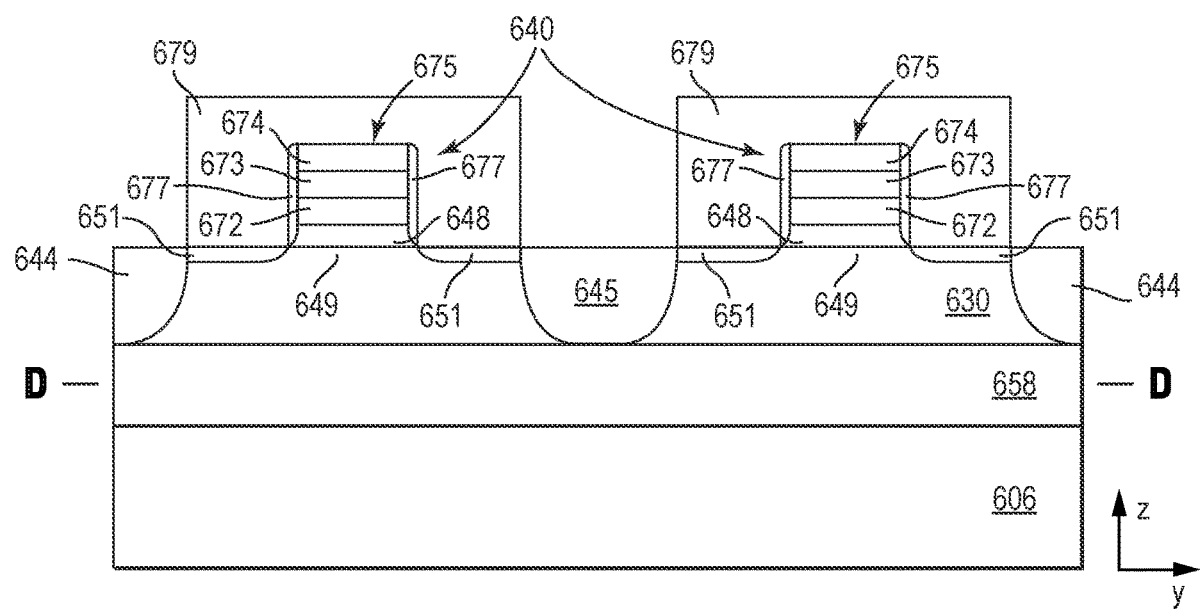

FIG. 6G is a cross-section in the y-z plane, as viewed along any of the lines D-D in FIG. 6C, corresponding to a particular stage of processing following the stage of processing corresponding to FIG. 6F. In FIG. 6G, mask elements 679 (e.g., of photoresist) are formed over stacks 675 and portions of conductive regions 651. Subsequently, source/drains 644 and a source/drain 645 (e.g., N+ source/drains) that can be source/drains 444 and a source/drain 445 are implanted in portions of conductive regions 651 uncovered by mask elements 679, extending into portions of monocrystalline semiconductor segment 630 that underlie the portions of conductive regions 651 uncovered by mask elements 679. A channel region 649 that can be a channel region 449 can be between portions of conductive regions 651 covered by mask elements, and thus between a source/drain 644 and a source/drain 645.

The adjacent string drivers 640 in FIG. 6G that can be string drivers 440 can each include a respective portion of monocrystalline semiconductor segment 630, including a respective source/drain 644 and shared source/drain 645, and a stack 675 directly over a respective channel region 649. Each respective string driver 640 can include a respective conductive region 651 between a respective channel 649 and a respective source/drain 644 and a respective conductive region 651 between the respective channel 649 and the source/drain 645.

Figure 6H:
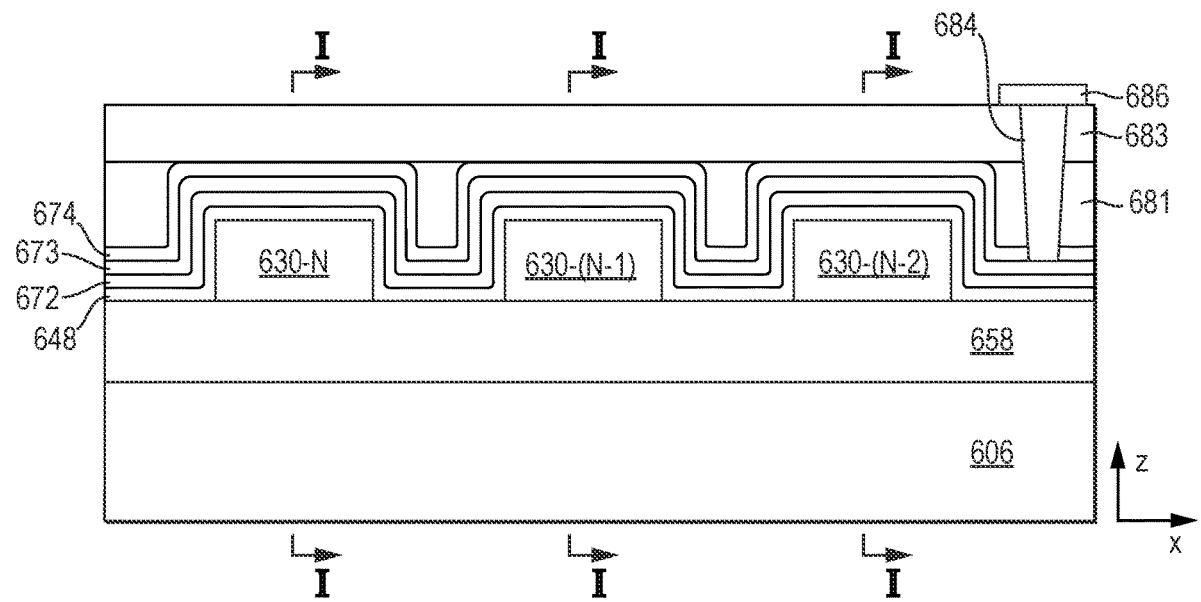
Figure 6I:
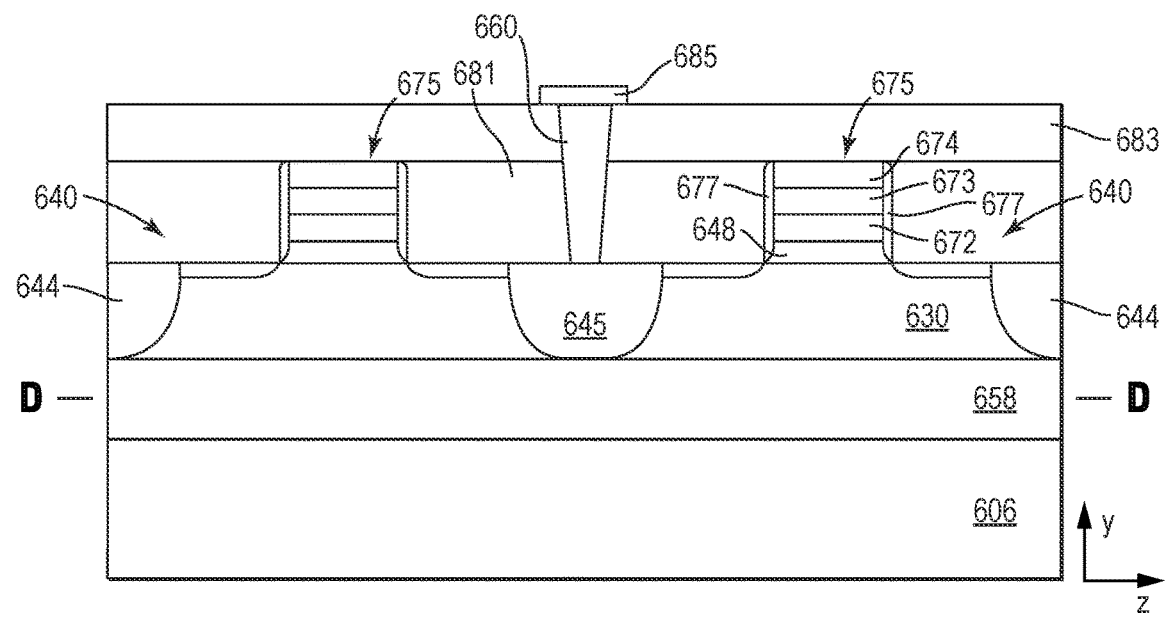

FIG. 6H is a cross-section in the x-z plane corresponding to a particular stage of processing following the stage of processing corresponding to FIG. 6G. FIG. 6I is a cross-section in the y-z plane, as viewed along any one of the lines I-I in FIG. 6H, corresponding to the particular stage of processing of FIG. 6H. As such, reference number 630 can be used in FIG. 6I to generally refer to each, or any, of monocrystalline semiconductor segments 630-(N−2) to 630-N. The structures in FIGS. 6H and 6I can be formed concurrently, for example.

A dielectric 681, such as a spin-on dielectric, can be formed concurrently over dielectric 674 in FIG. 6H and over string drivers 640 in FIG. 6I. A portion of dielectric 681 can be subsequently removed, such as by chemical mechanical planarization (CMP), so that an upper surface dielectric 681 is coplanar with the uppermost surfaces of dielectric 674.

A dielectric 683, such as tetraethyl orthosilicate (TEOS), oxide, or the like, can then be formed over the upper surface dielectric 681 and the uppermost surfaces of dielectric 674. A mask (not shown) can be formed over dielectric 683 and patterned to expose portions of dielectric 683 and dielectric 681 for removal. The portions can be subsequently removed (e.g., by etching) to form openings that can stop at or in conductor 673 and source/drain 645.

A conductive contact 660 that can be a contact 460 can be formed in the opening that can stop at or in source/drain 645 so that contact 660 is in direct physical contact with source/drain 645. A conductive contact 684 can be formed in the opening that can stop at or in conductor 673 so that contact 684 is in direct physical contact with conductor 673. Conductive lines 685 and 686 can then be formed over dielectric 683 to be respectively in direct physical contact with contacts 660 and 684. Conductive line 685 can be coupled to circuitry configured to supply access signals to string drivers 640 via source/drain 645. Conductive line 686 can be coupled to logic circuitry, such as logic circuitry 242 or 342, configured to supply control signals to conductor 673, and thus to gate 647, to activate the string drivers 640 commonly coupled thereto.

In some examples, source/drains 644 can be coupled to the access lines of steps of respective stairstep structures, as previously described in conjunction with FIGS. 4B and 4C. Note that FIG. 6H can correspond to FIG. 4D, and FIG. 6I can correspond to FIG. 4B.

Figure 7A:
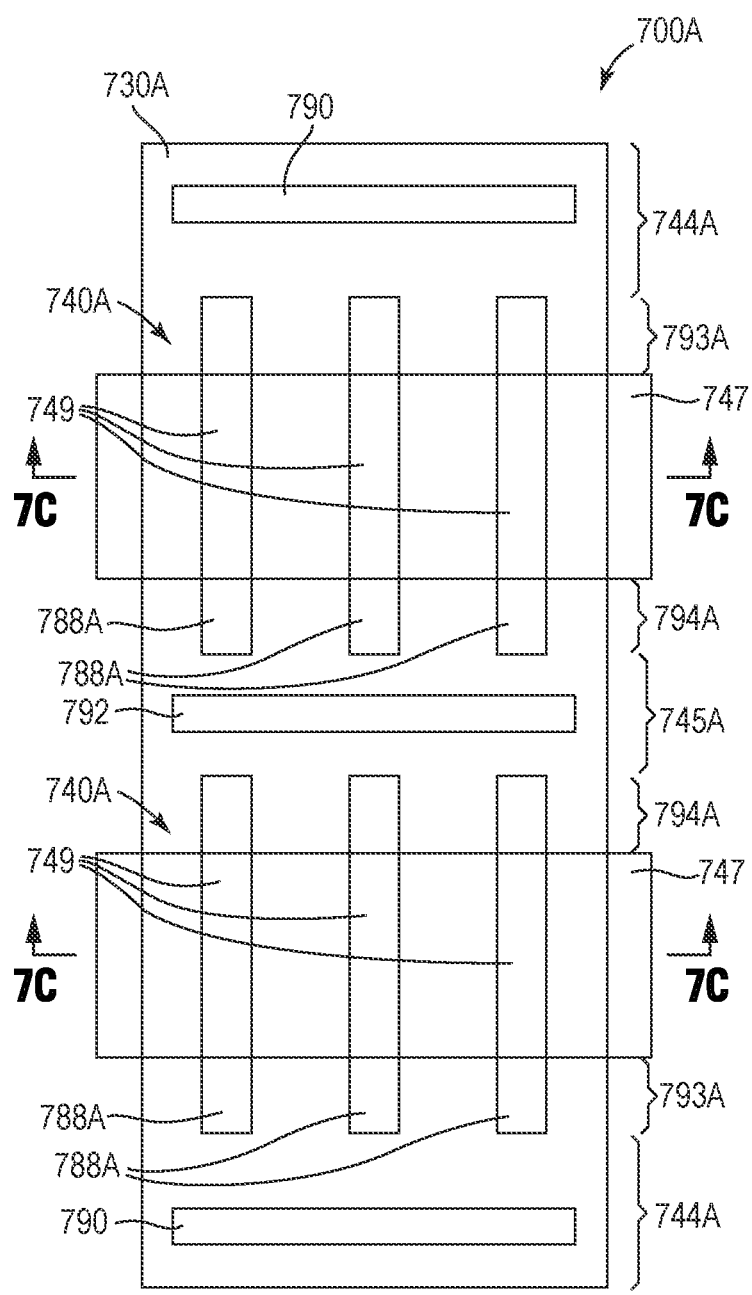
FIG. 7A is a top-down view of a portion of a memory in accordance with a number of embodiments of the present disclosure.
Figure 7B:
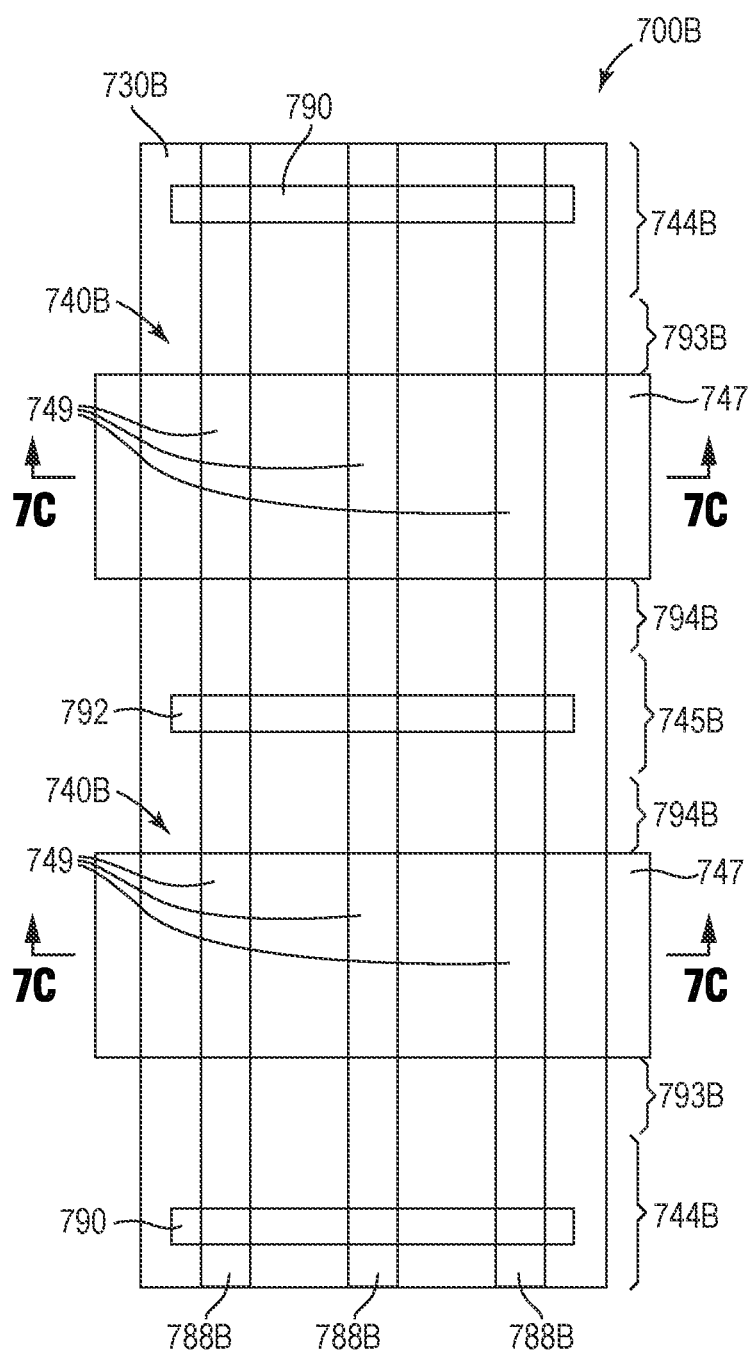
FIG. 7B is a top-down view of a portion of a memory in accordance with a number of embodiments of the present disclosure.
Figure 7C:
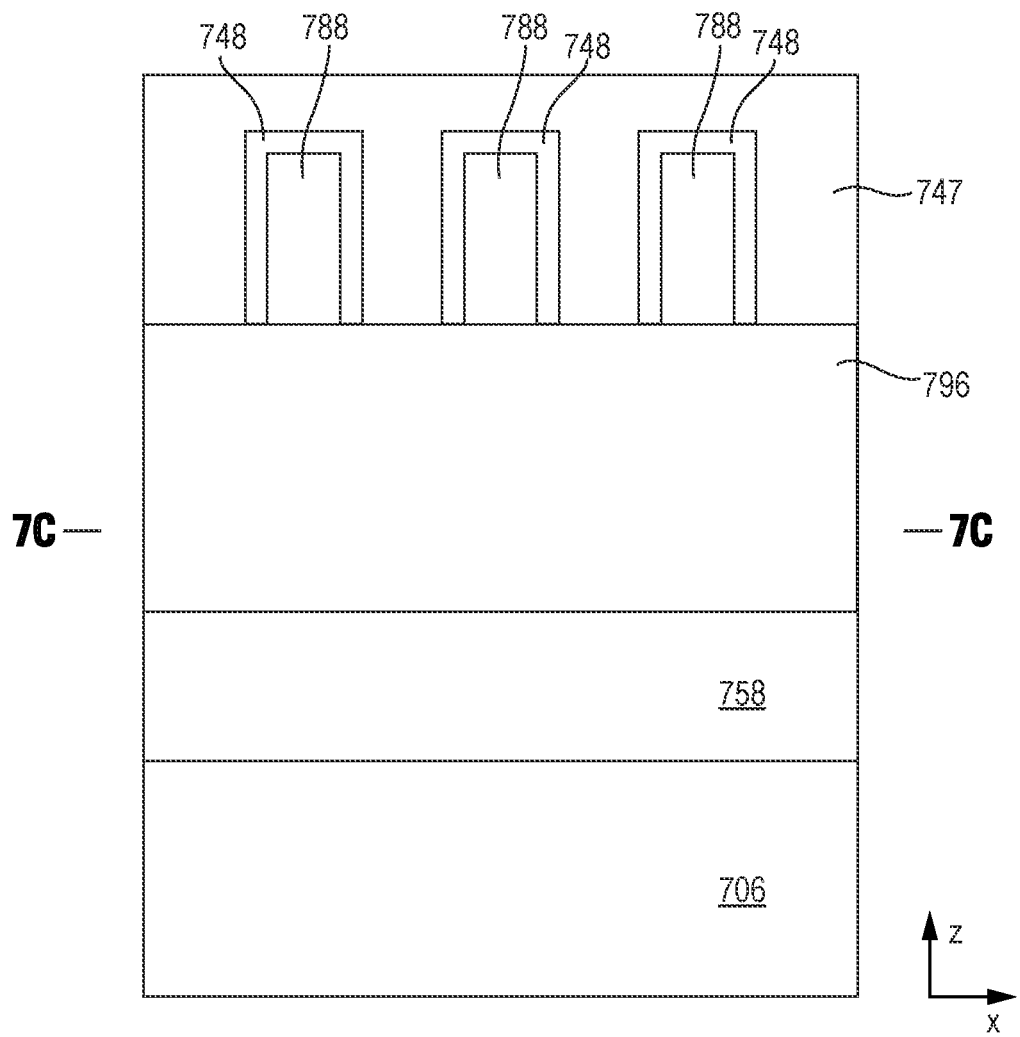
FIG. 7C is a cross-section viewed along lines 7C-7C in FIGS. 7A and 7B.

FIG. 7A is a top-down view of a portion of a memory 700A that can be various memories disclosed herein memory 100 in accordance with a number of embodiments of the present disclosure. FIG. 7B is a top-down view of a portion of a memory 700B can be various memories disclosed herein in accordance with a number of embodiments of the present disclosure. FIG. 7C is a cross-section in the x-z plane viewed along any of the lines 7C-7C in FIGS. 7A and 7B.

Memories 700A and 700B respectively include respective string drivers 740A and 740B that can be directly above stairstep structures, such as stairstep structures 403-1 and 403-2 respectively of blocks 435-1 and 435-2. One of string drivers 740A or one of the string drivers 700B can be directly above and coupled to a step of a respective stairstep structure, such as stairstep structure 403-1, and the other of the string drivers 740A or the other of the string drivers 740B can be directly above and coupled to a step of another respective stairstep structure, such as stairstep structure 403-2.

String drivers 740A can respectively include respective groups monocrystalline semiconductor fins 788A (e.g., monocrystalline silicon fins) formed in respective portions of a monocrystalline semiconductor 730A that can be a monocrystalline semiconductor 430, monocrystalline semiconductor 530, or a monocrystalline semiconductor segment 630. A respective gate 747 can be over each respective group of fins 788A. For example, the respective portions of the respective groups of monocrystalline semiconductor fins 788A that are covered by a respective gate 747 can be respective channel regions 749.

Each respective string driver 740A can include a respective source/drain 744A (e.g., an N+ source/drain) that can be analogous to a source/source drain 444 and that can be coupled to the step of the respective stairstep structure. For example, a respective contact 790 can couple each respective source/drain 744A to the step of the respective stairstep structure. Note that the respective contacts 790 can be under their respective source/drains 744A.

A source/drain 745A (e.g., an N+ source/drain) that can be analogous to a source/drain 445 and that can be common to (e.g., shared by) the respective string drivers 740A can be between the respective groups of fins 788A. A contact 792 can couple source/drain 745A to circuitry configured to supply access signals to the source/drain 745A, and thus to the respective steps coupled to the respective string drivers 740A upon activation of the respective string drivers 740A. Note that contact 792 can be above source/drain 745A.

In some examples, a respective conductive region 793A (e.g., an N-region) can between a respective gate 747 and a respective source/drain 744A. For example, the respective conductive region 793A, including the portions of fins 788A in the respective region 793A, can be conductively doped (e.g., to an N-conductivity). In some examples, a respective conductive region 794A (e.g., an N-region) can between a respective gate 747 and source/drain 745A. For example, the respective conductive region 794A, including the portions of fins 788A in the respective region 794A, can be conductively doped (e.g., to an N− conductivity).

In FIG. 7B, a group of monocrystalline semiconductor fins 788B is formed in a monocrystalline semiconductor 730B that can be a monocrystalline semiconductor 430, monocrystalline semiconductor 530, or a monocrystalline semiconductor segment 630. String drivers 740B can respectively include respective portions of the group of monocrystalline semiconductor fins 788B. For example, the group of monocrystalline semiconductor fins 788B can be common to string drivers 740B. A respective gate 747 of a respective string driver 740B can be over the respective portion of the group of monocrystalline semiconductor fins 788B. For example, the respective portions of the monocrystalline semiconductor fins 788B that are covered by a respective gate 747 can be respective channel regions 749.

Each respective string driver 740B can include a respective source/drain 744B (e.g., an N+ source/drain) that can be analogous to a source/source drain 444 and that can be coupled to the step of the respective stairstep structure. For example, each respective source/drain 744B can include a respective portion of the group of fins 788B such that the respective portion of the group of fins 788B is conductively doped (e.g., to an N+ conductivity). A respective contact 790 can couple each respective source/drain 744B to the step of the respective stairstep structure. Note that the respective contacts 790 can be under their respective source/drains 744B.

A source/drain 745B (e.g., an N+ source/drain) that can be analogous to a source/drain 445 and that can be common to (e.g., shared by) the respective string drivers 740B can be between the respective control gates 746. A contact 792 can couple source/drain 745B to circuitry configured to supply access signals to the source/drain 745B, and thus to the respective steps coupled to the respective string drivers 740B upon activation of the respective string drivers 740B. For example, source/drain 745B can include a respective portion of the group of fins 788B such that the respective portion of the group of fins 788B is conductively doped (e.g., to an N+ conductivity). Note that contact 792 can be above source/drain 745A.

In some examples, a respective conductive region 793B (e.g., an N-region) can between a respective gate 747 and a respective source/drain 744B. For example, the respective conductive region 793B, including the portions of fins 788A in the respective region 793B, can be conductively doped (e.g., to an N-conductivity). In some examples, a respective conductive region 794B (e.g., an N-region) can between a respective gate 747 and source/drain 745B. For example, the respective conductive region 794B, including the portions of fins 788A in the respective region 794B, can be conductively doped (e.g., to an N− conductivity).

In FIG. 7C, the monocrystalline semiconductors 730A and 730B and the fins 788A and 788B in FIGS. 7A and 7B are respectively generally referred to as monocrystalline semiconductor 730 and fins 788. In FIG. 7C, a dielectric 758 that can be dielectric 458 or dielectric 658 can be above a memory array 706 that can be various memory arrays disclosed herein. For example, dielectric 758 can be directly above a stairstep structure, such as stairstep structure 103, 403-1, or 403-2 and can extend above a memory-cell region of array 706 that can be various memory-cell regions disclosed herein.

A dielectric 796 that can be oxide can be formed over (e.g., in direct physical contact with) dielectric 758. Monocrystalline semiconductor 730 can be above dielectric 796, and thus can be directly above the stairstep structure or the memory-cell region. In some examples, monocrystalline semiconductor 730 can be attached to an upper surface of dielectric 796 as previously described in conjunction with FIGS. 5A to 5C. Fins 788 can be formed from monocrystalline semiconductor 730 so that fins 788 extend from an upper surface of dialectic 796.

Respective gate dielectrics 748 that can be gate dielectrics 448 or 648 can be formed around the portions of the respective fins 788. For example, a respective gate dielectric 748 can be in direct physical contact with a respective fin 788 and can be adjacent to the top and sides of the respective fin 788. A gate 747 can be formed over (e.g., and in direct physical contact with) gate dielectrics 748.

Gate 747 can be adjacent to the top and sides of the respective gate dielectrics 748. This can increase the capacitive coupling area between gate 747 and fins 788 compared to the capacitive coupling area between a planar gate and a planar monocrystalline semiconductor. As such, for the same capacitive coupling area, the finned structure can take up less room in the x-direction than a planar structure, thereby allowing for higher string-driver densities (more string drivers) above array 706.

Figure 8A:
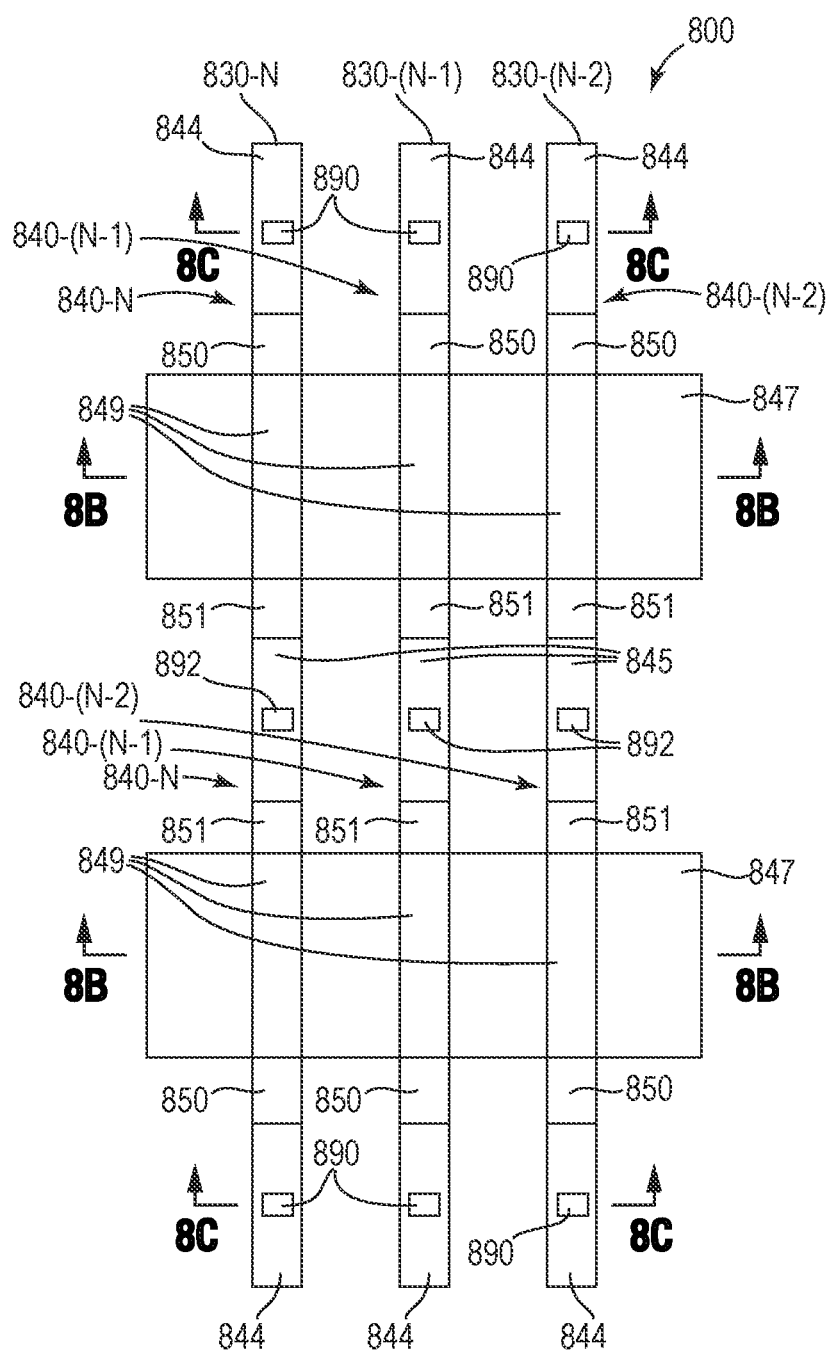
FIG. 8A is a top-down view of a portion of a memory in accordance with a number of embodiments of the present disclosure.
Figure 8B:
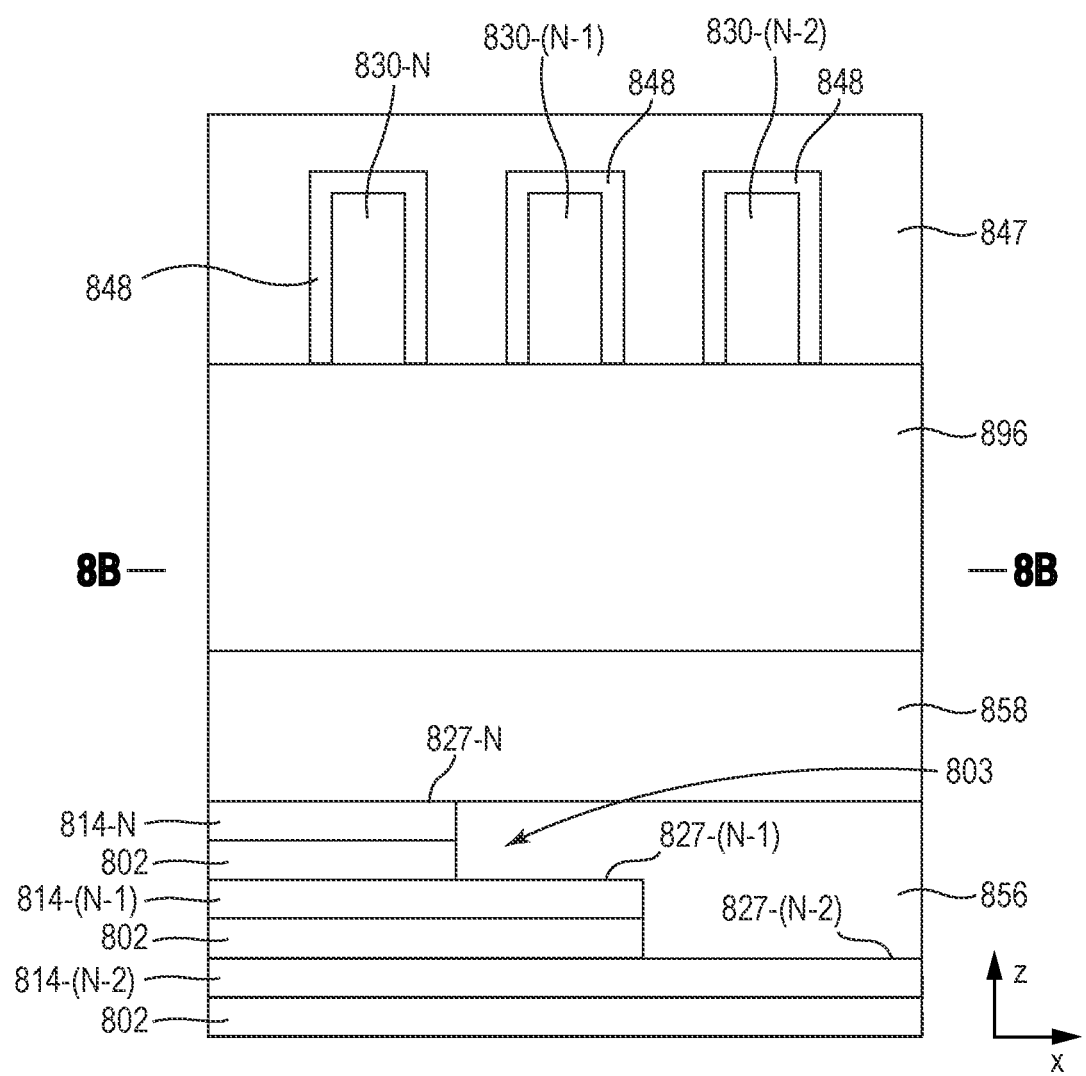
FIGS. 8B and 8C are various cross-sectional views associated with FIG. 8A in accordance with a number of embodiments of the present disclosure.
Figure 8C:
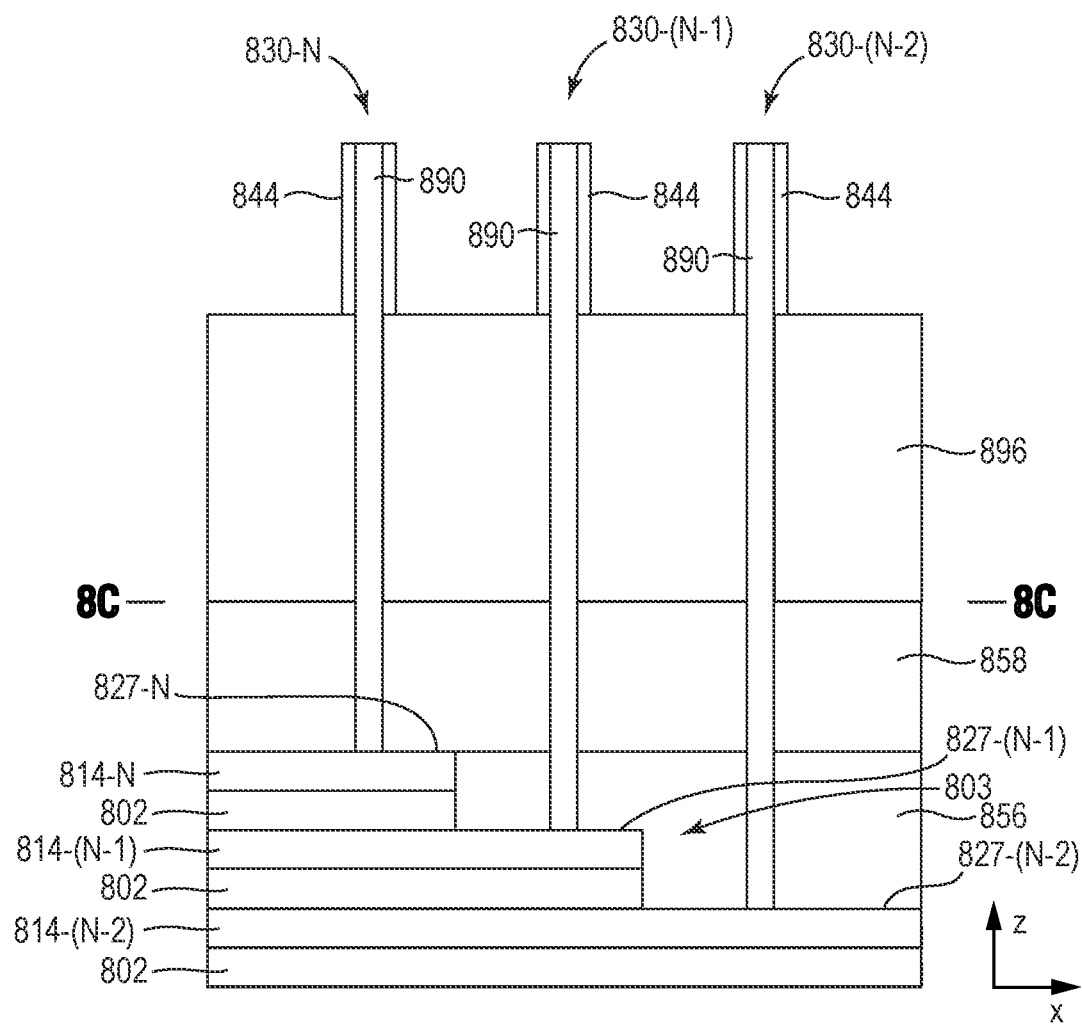

FIG. 8A is a top-down view of a portion of a memory 800, that can be various memories disclosed herein, in accordance with a number of embodiments of the present disclosure. FIGS. 8B and 8C are various cross-sectional views associated with FIG. 8A in accordance with a number of embodiments of the present disclosure. FIG. 8B is a cross-section in the x-z plane viewed along any of lines 8B-8B in FIG. 8A. FIG. 8C is a cross-section in the x-z plane viewed along any of lines 8C-8C in FIG. 8A.

Memory 800 includes respective sets of string drivers 840-(N−2) to 840-N that can be respectively directly above stairstep structures, such as stairstep structures 403-1 and 403-2 respectively of blocks 435-1 and 435-2. For example, string drivers 840-(N−2) to 840-N can respectively replace string drivers 440-(N−2) to 440-N.

The string drivers 840-(N−2) to 840-N of the respective sets can be respectively directly above and respectively coupled to the steps 827-(N−2) to 827-N (shown in FIGS. 8B and 8C) of the respective stairstep structures. Note that the steps 827-(N−2) to 827-N can respectively include access lines 814-(N−2) to 814-N that can be access lines 414-(N−2) to 414-N and that can be respectively above dielectrics 802 that can be dielectrics 102 or 402.

One string driver 840 from each set can include a respective portion of a monocrystalline semiconductor fin 830. For example, a string driver 840-(N−2) from each set can include a respective portion of fin 830-(N−2); a string driver 840-(N−1) from each set can include a respective portion of fin 830-(N−1); and a string driver 840-N from each set can include a respective portion of fin 830-N. In some examples, fins 830-(N−2) to 830-N can respectively replace monocrystalline semiconductors 430-(N−2) to 430-N.

Each of the string drivers 840 from each set can include a respective source/drain 844 (e.g., an N+ source/drain) that can be analogous to a source/drain 444 and that can be coupled to the respective step of the respective stairstep structure. For example, a respective source/drain 844 of a respective string driver 840 can be formed in a respective portion of a respective fin 830. A respective contact 890 can couple each respective source/drain 844 to a respective step. For example, source/drains 844 respectively in fins 830-(N−2) to 830-N can be respectively coupled to access lines 814-(N−2) to 814-N by contacts 890, as shown in FIG. 8C. Note that the respective contacts 890 can pass through their respective source/drains 844.

A source/drain 845 (e.g., an N+ source/drain) that can be analogous to a source/drain 445 can be formed in each fin 840 between the respective string drivers corresponding to the respective fin 840. For example, a source/drain 845 in fin 830-(N−2) can be between and common to string drivers 840-(N−2); a source/drain 845 in fin 830-(N−1) can be between and common to string drivers 840-(N−1); and a source/drain 845 in fin 830-N can be between and common to string drivers 840-N. A respective contact 892 can couple each respective source/drain 845 to circuitry configured to supply access signals to the respective source/drain 845, and thus to the respective steps 827 coupled to the respective string drivers 840 sharing the respective source/drain 845, upon activation of the respective string drivers 840. Note that contacts 892 can be above their respective source/drains 845.

A respective gate 847 that can be a gate 447 can be commonly coupled each set of string drivers 840. The respective portions of fins 830-(N−2) to 830-N that are covered by a respective gate 847 can be respective channel regions 849 of the respective string drivers of a respective set. In some examples, the respective gates 847 can be coupled to receive control signals for activating the string drivers 840 coupled to the respective gates 847. Note that string drivers 840 can be finFETs.

Respective conductive regions 850 (e.g., N− regions) that can be analogous to conductive regions 450 can be formed in each respective fin 830 respectively between gates 847 and source/drains 844. Respective conductive regions 851 (e.g., N− regions) that can be analogous to conductive regions 451 can be formed in each respective fin 830 respectively between gates 847 and source/drain 845.

In FIGS. 8B and 8C, a dielectric 858 that can be dielectric 458 or dielectric 658 can be directly above a stairstep structure 803 that can be a portion of stairstep structure 103 or a stairstep structure 403. For example, dielectric 858 can be above a dielectric 856 that can be dielectric 456 and that can be over stairstep structure 803. A dielectric 896 that can be oxide can be formed over (e.g., in direct physical contact with) dielectric 858. Fins 830 can be formed from a monocrystalline semiconductor that can be attached to an upper surface of dielectric 896 as previously described in conjunction with FIGS. 5A to 5C. Fins 830 can extend from the upper surface of dielectric 896.

Respective gate dielectrics 848 that can be gate dielectrics 448, 648, or 748 can be formed around portions of the respective fins 830. For example, a respective gate dielectric 848 can be in direct physical contact with a respective fin 830 and can be adjacent to the top and sides of the respective fin 830.

A gate 847 can be formed over (e.g., and in direct physical contact with) gate dielectrics 848. Gate 847 can be adjacent to the top and sides of the respective gate dielectrics 848. This can increase the capacitive coupling area between gate 847 and fins 830 compared to the capacitive coupling area between a planar control gate and a planar monocrystalline semiconductor. This allows for higher string-driver densities so that a respective string driver can be directly above each respective step 827 and coupled to each respective step by a straight contact 890, as shown in FIG. 8C. For example, the respective contacts 890 can pass through their respective source/drains 844.

Figure 9:
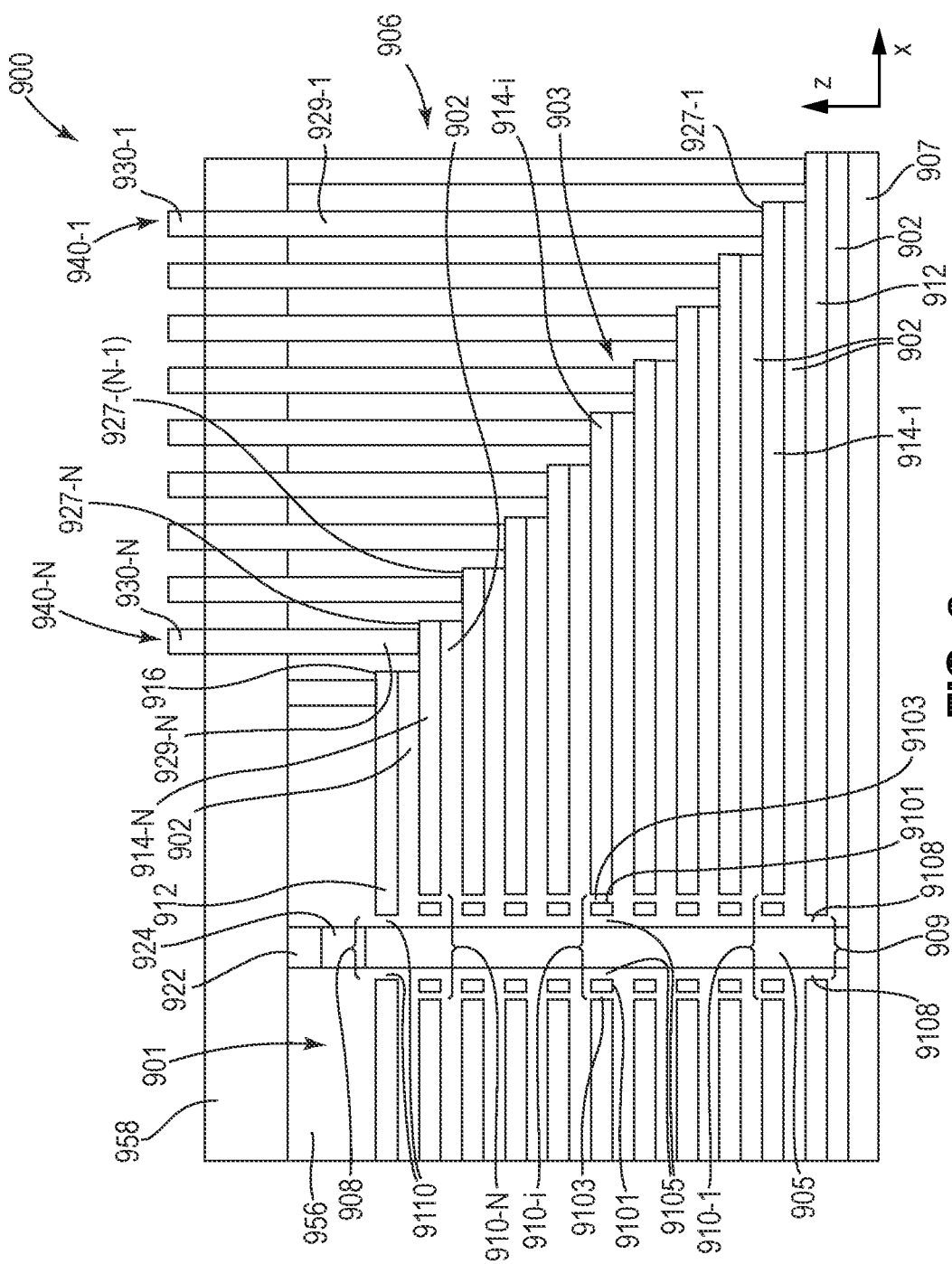
FIG. 9 is a cross-sectional view of a portion of a memory in accordance with a number of embodiments of the present disclosure.

FIG. 9 is a cross-sectional view in the x-z plane of a portion of a memory 900, that can be a portion of various memories disclosed herein, in accordance with a number of embodiments of the present disclosure.

Memory 900 can include a stacked memory array 906 that can be a portion of stacked memory array 106, for example. Array 906 can include a memory-cell region 901 that can be a portion of memory-cell region 101 and a stairstep structure 903 adjacent to memory-cell region 901 that can be a portion of stairstep structure 103. A group of string drivers 940-1 to 940-N can be directly above stairstep structure 903. For example, string drivers 940 can be various string drivers disclosed herein.

Stairstep structure 903 can include steps 927-1 to 927-N that can be between and uppermost step 916 and a lowermost step 916. Array 906 can include a (e.g., vertical) stack of access lines 914-1 to 914-N in the z-direction such that steps 927-1 to 927-N respectively include access lines 914-1 to 914-N. Each step 927 can include a respective access line 914 over a respective dielectric 902. Uppermost step 916 can include an upper select line 912 over a dielectric 902, and lowermost step 916 can include a lower select line 914 over a dielectric 902 that can be over a semiconductor 907 that can be semiconductor 107.

String drivers 940-1 to 940-N can be respectively directly over and coupled to access lines 914-1 to 914-N. In some examples, string drivers 940-1 to 940-N can respectively include monocrystalline semiconductors 930-1 to 930-N than can be monocrystalline semiconductors 430, monocrystalline semiconductors 430, monocrystalline semiconductor segments 630, finned monocrystalline semiconductors 730A, finned monocrystalline semiconductors 730B, or monocrystalline semiconductor fins 830.

String drivers 940-1 to 940-N, and thus monocrystalline semiconductors 930-1 to 930-N, can be over a dielectric 958 that can be dielectric 458, 658, 758, or 858 and that can be over memory-cell region 901 and stairstep structure 903, and thus over array 906. For example, dielectric 958 can be over a dielectric 956 that can be dielectric 456 or 856 and that can be over memory-cell region 901 and stairstep structure 903. Monocrystalline semiconductors 930-1 to 930-N are respectively coupled to steps 927-1 to 927-N by contacts 929-1 to 929-N.

Access lines 914-1 to 914-N can be respectively coupled to memory cells 910-1 to 910-N. Memory cells 910-1 to 910-N can be coupled in series to form a string of series-coupled memory cells that can be adjacent to a semiconductor structure 905 (e.g., that can pass vertically through memory cell region 901) that can be a semiconductor structure 105.

The string can be between a select transistor 908 and select transistor 909. For example, select transistor 908 can be at an intersection of upper select line 912 and semiconductor structure 905, and select transistor 909 can be at an intersection of lower select line 912 and semiconductor structure 905.

Each of memory cells 910-1 to 910-N can include a charge-storage structure 9101, such as a charge trap or a floating gate, e.g., at the intersection of semiconductor structure 905 and a respective access line 910. Each of memory cells 910-1 to 910-N can include a dielectric 9103, such as a blocking dielectric, that can be between a respective access line 914 and a respective charge-storage structure 9101. For example, a dielectric 9103 of memory cell 910-$i$ may be between access line 914-$i$ and the charge-storage structure 9101 of memory cell 910-$i$.

Each of memory cells 910-1 to 910-N can include a dielectric 9105, such as a tunnel dielectric, that can be between a respective charge-storage structure 9101 and semiconductor structure 905. For example, a dielectric 9105 of memory cell 910-$i$ can be between the charge-storage structure 9101 of memory cell 910-$i$ and semiconductor structure 905. Dielectric 9103, charge-storage structure 9101, and dielectric 9105 can wrap completely around semiconductor structure 905, for example, and can be at the intersection of an access line 914 and semiconductor structure 905.

Select transistor 909 can include a control gate that can be included in the lower select line 912. A dielectric 9108, such as a gate dielectric, of select transistor 909 can be between lower select line 912 and semiconductor structure 905. Lower select line 912 and dielectric 9108, and thus select transistor 909, can wrap completely around semiconductor structure 905, for example.

Select transistor 908 can include a control gate that can be included in the upper select line 912. A dielectric 9110, such as a gate dielectric, of select transistor 908 can be between upper select line 912 and semiconductor structure 905. Upper select line 912 and dielectric 9110, and thus select transistor 908, can wrap completely around semiconductor structure 905, for example. A data line 922 can be coupled to an end of semiconductor structure 905, and thus to select transistor 908, by a contact 924, for example.

Figure 10:
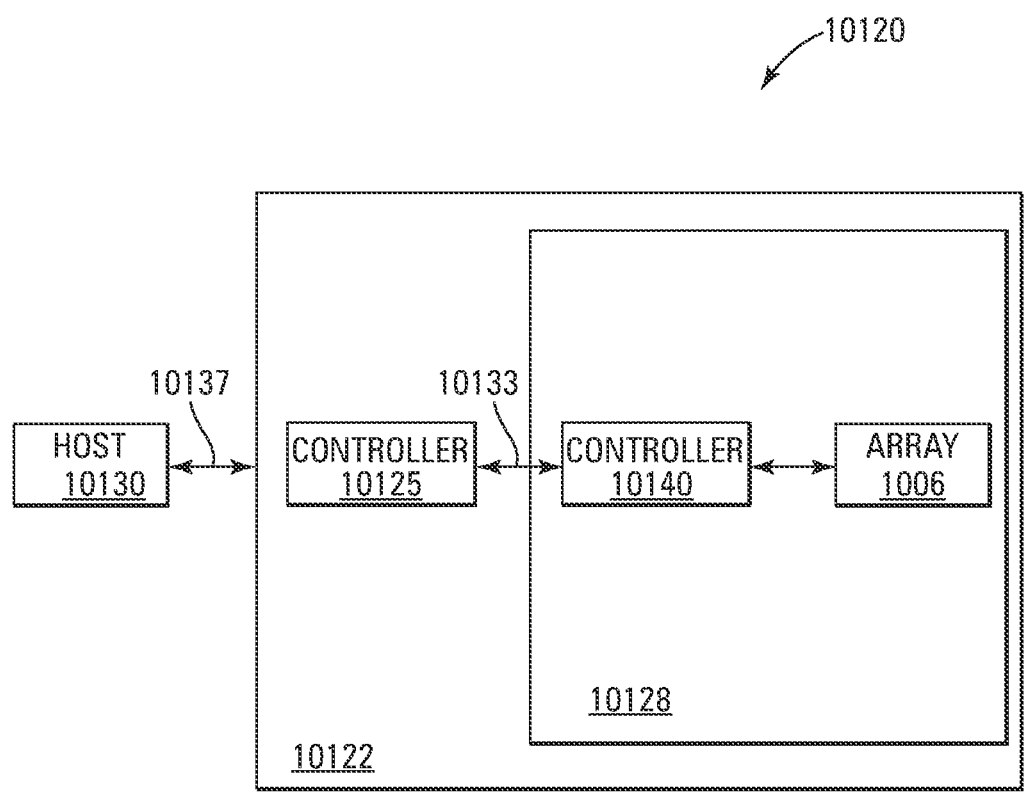
FIG. 10 is a block diagram of an apparatus in accordance with a number of embodiments of the present disclosure.

FIG. 10 is a block diagram of an apparatus in the form of a computing system 10120 in accordance with a number of embodiments of the present disclosure. Computing system 10120 includes a memory system 10122 that can be, for example, a storage system such as an SSD, a UFS device, an eMMC device, etc. However, embodiments are not limited to a particular type of memory system. For example, memory system 10122 could serve as main memory for system 10120.

As shown in FIG. 10, memory system 10122 can include a controller 10125 that may be referred to as a memory system controller, in that controller 10125 can control a memory 10128 that can be various memories disclosed herein. Controller 10125 is coupled to a host 10130 and to memory 10128. For example, memory 10128 can include a number of memory devices (e.g., dies, chips, etc.) and can serve as a memory (e.g., main memory) and/or as a storage volume for computing system 10120.

Memory 10128 can be coupled to controller 10125 via an interface 10133 (e.g., memory interface) that can include a data bus and that can support various standards and/or comply with various interface types, such as double data rate (DDR), etc. Controller 10125 can receive commands, such as read and write commands from host 10130. Controller 10125 can, for example, receive host data to be written to memory 10122 from host 10130 via a host interface 10137. As used herein, a memory system 10122, a controller 10125, a memory 10128, or a controller 10140 might also be separately considered an "apparatus."

Host 10130 can be, for example, a host system, such as a personal laptop computer, a desktop computer, a digital camera, a mobile device (e.g., cellular phone), network server, Internet of Things (IoT) enabled device, or a memory card reader, among various other types of hosts. For instance, host 10130 can include one or more processors capable of accessing memory 10128 (e.g., via controller 10125) over interface 10137 that can include a bus. Interface 10137 may be a standardized interface, such as a serial advanced technology attachment (SATA), peripheral component interconnect express (PCIe), or a universal serial bus (USB), among various others.

Memory 10128 can include a number of memory arrays 1006 (e.g., referred to collectively as array 1006) and a controller 10140 that may be referred to as an embedded controller. In some examples, array 1006 can be a stacked memory array (e.g., a 3D NAND array) that can be array 106 or 906. String drivers, such as various string drivers disclosed herein, can be above memory array 1006. For example, memory array 1006 can include a stairstep structure. Steps of the stairstep structure can be respectively commonly coupled to respective levels of non-volatile memory cells in memory array 1006. The respective string drivers above memory array 1006 can include respective monocrystalline semiconductor structures respectively coupled to the steps.

Controller 10140 can be located internal to the memory 10128, and can receive commands (e.g., write commands, read commands, etc.) from the controller 10125 via the memory interface 10133. Controller 10140 can include a state machine and/or a sequencer. Controller 10140 can be configured to control the operation of memory 10128.

In the preceding detailed description, reference is made to the accompanying drawings that form a part hereof, and in which is shown, by way of illustration, specific examples. In the drawings, like numerals describe substantially similar components throughout the several views. Other examples may be utilized, and structural, logical, and/or electrical changes may be made without departing from the scope of the present disclosure.

The figures herein follow a numbering convention in which the first digit or digits correspond to the drawing figure number and the remaining digits identify an element or component in the drawing. Similar elements or components between different figures may be identified by the use of similar digits. For example, 130 may reference element "30" in FIG. 1, and a similar element may be referenced as 430 in FIG. 4A. As will be appreciated, elements shown in the various embodiments herein can be added, exchanged, and/or eliminated so as to provide a number of additional embodiments of the present disclosure. In addition, as will be appreciated, the proportion and the relative scale of the elements provided in the figures are intended to illustrate the embodiments of the present disclosure and should not be taken in a limiting sense.

As used herein, "a number of" or a "quantity of" something can refer to one or more of such things. For example, a number of or a quantity of memory cells can refer to one or more memory cells. A "plurality" of something intends two or more. As used herein, multiple acts being performed concurrently refers to acts overlapping, at least in part, over a particular time period. As used herein, the term "coupled" may include electrically coupled, directly coupled, and/or directly connected with no intervening elements (e.g., by direct physical contact), indirectly coupled and/or connected with intervening elements, or wirelessly coupled. The term coupled may further include two or more elements that co-operate or interact with each other (e.g., as in a cause and effect relationship).

Although specific examples have been illustrated and described herein, those of ordinary skill in the art will appreciate that an arrangement calculated to achieve the same results can be substituted for the specific embodiments shown. This disclosure is intended to cover adaptations or variations of one or more embodiments of the present disclosure. It is to be understood that the above description has been made in an illustrative fashion, and not a restrictive one. The scope of one or more examples of the present disclosure should be determined with reference to the appended claims, along with the full range of equivalents to which such claims are entitled.

What is claimed is:

1. An apparatus, comprising:
   a stacked memory array comprising a plurality of levels of memory cells, each respective level of memory cells commonly coupled to a respective access line;
   a dielectric material formed on the stacked memory array; and
   a plurality of drivers above the stacked memory array;
   wherein each driver of the plurality of drivers comprises a channel region formed in a monocrystalline semiconductor that is transferred to a surface of the dielectric material, with the monocrystalline semiconductor being bonded to the dielectric as opposed to being formed on the dielectric; and
   wherein each driver of the plurality of drivers comprises a fin formed of the monocrystalline semiconductor.

2. The apparatus of claim 1, wherein the monocrystalline semiconductor comprises monocrystalline silicon.

3. The apparatus of claim 1, wherein the monocrystalline semiconductor comprises monocrystalline silicon germanium.

4. The apparatus of claim 1, wherein each driver of the plurality of drivers comprises a first source/drain region formed in the monocrystalline semiconductor and coupled to one of the respective access lines.

5. The apparatus of claim 4, wherein the first source/drain region comprises a first conductively doped region of the monocrystalline semiconductor.

6. The apparatus of claim 1, wherein each respective access line forms a respective step of a stairstep structure and the plurality of drivers is directly above the stairstep structure.

7. The apparatus of claim 1, wherein the plurality of drivers share a common gate.

8. A method, comprising:
   forming a stacked memory array comprising a plurality of levels of memory cells, each respective level of memory cells commonly coupled to a respective access line of a plurality of access lines, each access line forming a respective step of a stairstep structure;
   forming a first dielectric over the stacked memory array;
   transferring a bulk monocrystalline semiconductor to a surface of the first dielectric such that the first dielectric is located between the bulk monocrystalline semiconductor and the stacked memory array, with the bulk monocrystalline semiconductor being bonded to the first dielectric as opposed to being formed on the first dielectric;
   removing portions of the bulk monocrystalline semiconductor to form a plurality of monocrystalline semiconductor segments; and
   forming a plurality of drivers from the plurality of monocrystalline semiconductor segments, wherein each driver of the plurality of drivers includes a channel region between a first source/drain region and a second source/drain region, with the channel region being formed of the monocrystalline semiconductor material of the respective monocrystalline semiconductor segment; and
   wherein each string driver of the plurality of drivers comprises a fin formed of the monocrystalline semiconductor.

9. The method of claim 8, wherein forming the plurality of drivers comprises:
   forming a second dielectric over the plurality of segments; and forming the first source/drain region and the second source/drain region in the monocrystalline semiconductor of the respective monocrystalline semiconductor segment.

10. The method of claim 9, wherein forming the plurality of drivers comprises:
forming a second conductor over the second dielectric; and
forming a plurality of second conductors through the first dielectric to couple a respective first source/drain regions of the plurality of drivers to a respective one of the plurality of access lines.

11. The method of claim 8, wherein the method comprises, prior to bonding the bulk monocrystalline semiconductor directly to the first dielectric, performing an implantation process on the monocrystalline semiconductor.

12. The method of claim 11, wherein the method further comprises, subsequently to bonding the monocrystalline semiconductor directly to the first dielectric:
performing an anneal process to create a fragile region within the bulk monocrystalline semiconductor at a site of the prior implantation; and
cleaving the bulk monocrystalline semiconductor at the site of the prior implantation.

13. A memory device, comprising:
a stacked memory array comprising a plurality of levels of memory cells, each respective level of memory cells commonly coupled to a respective access line;
a dielectric material formed on the stacked memory array; and
a plurality of string drivers above the stacked memory array;
wherein each string driver of the plurality of string drivers comprises a channel region between a first source/drain region and a second source/drain region, and wherein the channel region is formed of monocrystalline silicon that is transferred to a surface of the dielectric material, with the monocrystalline silicon being bonded to the dielectric as opposed to being formed on the dielectric; and
wherein each string driver of the plurality of string drivers comprises a fin formed of the monocrystalline silicon.

14. The memory device of claim 13, wherein the stacked memory array comprises NAND memory cells.

15. The memory device of claim 13, wherein each respective access line forms a respective step of a stairstep structure.

16. The memory device of claim 15, wherein each string driver of the plurality of string drivers is directly above at least one step of the stairstep structure.

17. The memory device of claim 13, wherein each string driver is coupled to a respective one of the access lines via a respective vertical conductive contact.

18. The memory device of claim 17, wherein the respective vertical conductive contact is coupled to one of the first source/drain region or the second source/drain region.

19. The memory device of claim 13, wherein the first source/drain region is a doped region of the monocrystalline silicon.

* * * * *